US008816766B2

(12) United States Patent
Igarashi et al.

(10) Patent No.: US 8,816,766 B2
(45) Date of Patent: Aug. 26, 2014

(54) SEMICONDUCTOR INTEGRATED CIRCUIT, AND RECEPTION APPARATUS AND RADIO COMMUNICATION TERMINAL INCLUDING SEMICONDUCTOR INTEGRATED CIRCUIT

(71) Applicant: Renesas Mobile Corporation, Tokyo (JP)

(72) Inventors: Yutaka Igarashi, Tokyo (JP); Yusaku Katsube, Tokyo (JP)

(73) Assignee: Renesas Mobile Corporation, Tokyo (JP)

( * ) Notice: Subject to any disclaimer, the term of this patent is extended or adjusted under 35 U.S.C. 154(b) by 56 days.

(21) Appl. No.: 13/662,471

(22) Filed: Oct. 27, 2012

(65) Prior Publication Data

US 2013/0113567 A1 May 9, 2013

(30) Foreign Application Priority Data

Oct. 27, 2011 (JP) ................................. 2011-235557

(51) Int. Cl.
*H03F 3/45* (2006.01)
(52) U.S. Cl.
USPC ........................................... 330/69; 330/261
(58) Field of Classification Search
CPC ........................................................ H03F 3/45
USPC ................................... 330/69, 254, 260, 261
See application file for complete search history.

(56) References Cited

U.S. PATENT DOCUMENTS

| 6,756,850 B2 * | 6/2004 | Matsushita et al. ............ 330/285 |
| 2010/0253423 A1 * | 10/2010 | Pontarollo et al. .............. 330/69 |

OTHER PUBLICATIONS

Soundarapandian Karthikeyan et al., "Low-Voltage Analog Circuit Design Based on Biased Inverting Opamp Configuration", IEEE Journal of Solid-State Circuits, 2000, vol. 47, No. 3, pp. 176-184.
Aarno Parssinen, "Direct Conversion Receivers in Wide-Band Systems", Kluwer Academic Publishers, 2002, pp. 76-103.
Jing-Hong Conan Zhan et al., "A Broadband Low-Cost Direct-Conversion Receiver Front-End in 90nm CMOS", IEEE Journal of Solid-State Circuits, 2008, vol. 43, No. 5, pp. 1132-1137.
Tirdad Sowlati et al., "Quad-Band GSM/GPRS/EDGE Polar Loop Transmitter", IEEE Journal of Solid-State Circuits, 2004, vol. 39, No. 12, pp. 2179-2189.
Shimizu, T et al., "A Small GSM Power Amplifier Module Using Si-LDMOS Driver MMIC", ISSCC Digest of Technical Papers, 2004, pp.196-197.

* cited by examiner

*Primary Examiner* — Steven J Mottola
(74) *Attorney, Agent, or Firm* — Miles & Stockbridge P.C.

(57) ABSTRACT

A semiconductor integrated circuit includes: a first capacitance element and a second capacitance element; a first amplification circuit that amplifies a potential difference of a first voltage signal and a second voltage signal supplied via the first capacitance element and the second capacitance element, respectively, to output a first amplification signal and a second amplification signal; a first resistance element that feeds back the first amplification signal to one input terminal of the first amplification circuit; a second resistance element that feeds back the second amplification signal to another input terminal of the first amplification circuit; a voltage generator that generates a predetermined voltage; and a third resistance element that transmits the predetermined voltage generated by the voltage generator to each input terminal of the first amplification circuit.

11 Claims, 15 Drawing Sheets

SEMICONDUCTOR INTEGRATED CIRCUIT, AND RECEPTION APPARATUS AND RADIO COMMUNICATION TERMINAL INCLUDING SEMICONDUCTOR INTEGRATED CIRCUIT

CROSS-REFERENCE TO RELATED APPLICATIONS

This application is based upon and claims the benefit of priority from Japanese patent application No. 2011-235557, filed on Oct. 27, 2011, the disclosure of which is incorporated herein in its entirety by reference.

BACKGROUND

The present invention relates to a semiconductor integrated circuit, and a reception apparatus and a radio communication terminal including the semiconductor integrated circuit.

Typically, an amplification circuit having a function as a filter is provided in a radio communication terminal. For example, Soundarapandian Karthikeyan et al., "Low-Voltage Analog Circuit Design Based on Biased Inverting Opamp Configuration", IEEE JOURNAL OF SOLID-STATE CIRCUITS, 2000, VOL. 47, No. 3, pp. 176-184 discloses an apparatus including an amplification circuit.

SUMMARY

The present inventors have found various problems in the development of semiconductor integrated circuits used in radio communication terminals or the like. Each embodiment disclosed in this specification provides a semiconductor integrated circuit suitable for a radio communication terminal, for example. More detailed features will be made clear from the description of the specification and the accompanying drawings.

One aspect disclosed in this specification includes a semiconductor integrated circuit, and the semiconductor integrated circuit includes a voltage generation circuit that generates a predetermined voltage.

According to the present invention, it is possible to provide a semiconductor integrated circuit with high quality, and a reception apparatus and a radio communication terminal including the semiconductor integrated circuit.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

<Concept Before Reaching the Present Invention>

Figure 1A:
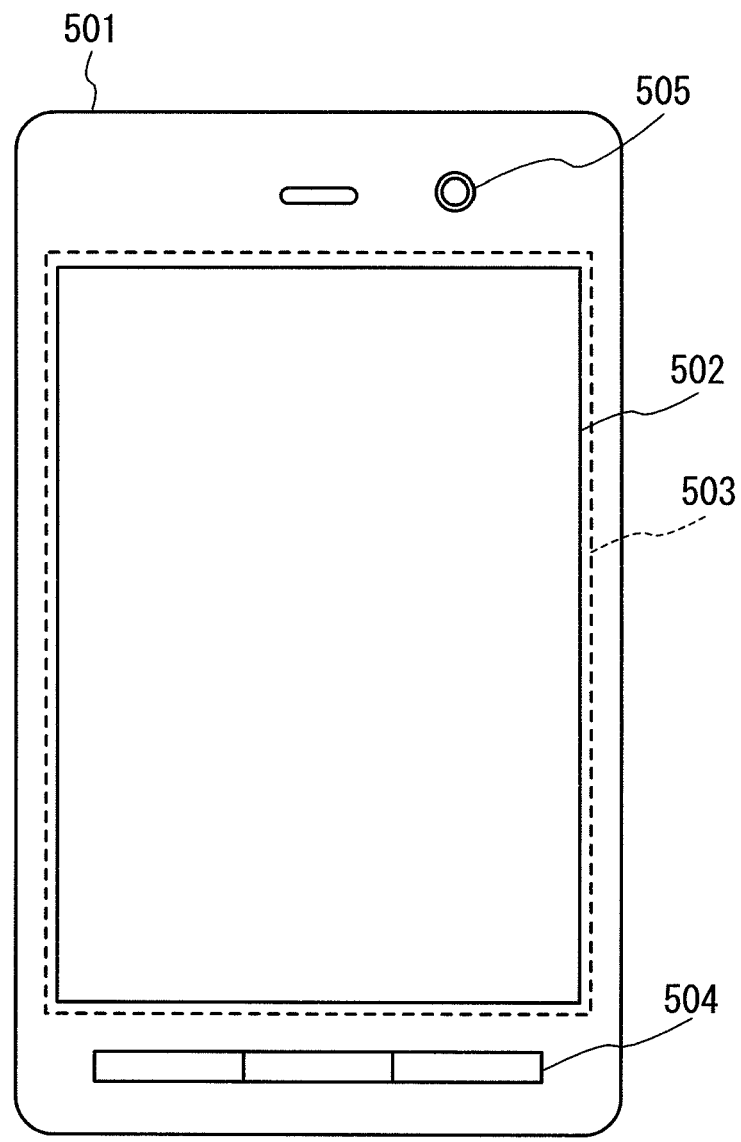
FIG. 1A is an external view showing one example of a radio communication terminal to which the present invention is applied.

Before describing embodiments of the present invention, a configuration studied by the present inventors before reaching the present invention will be described.

Conventionally, in a radio signal processing circuit mounted on a radio communication terminal or the like, each of a plurality of functional blocks (an amplifier that amplifies signals, a mixer that converts frequencies of the signals, a filter that passes only a signal in a desired band) was provided as a separate component. However, recent improvement in semiconductor techniques has made it possible to incorporate many of the plurality of functional blocks forming the radio signal processing circuit into one semiconductor chip. Further, a radio signal processing circuit that can deal with a plurality of radio access systems has been widely used in the field of mobile telephones, for example. Such a radio signal processing circuit incorporated into one or a plurality of semiconductor chips converts high-frequency signals received from an antenna into signals with high quality (low noise, high linearity, suppressing signals in bands other than a desired band) and having lower frequency bands.

In order to achieve the radio signal processing circuit with low cost, it is required to incorporate many of the plurality of functional blocks forming the radio signal processing circuit into one semiconductor chip. One difficulty in achieving this purpose is to incorporate a filter circuit that suppresses signals in bands other than a desired band into a semiconductor chip.

Typically, this filter circuit is formed using a SAW (Surface Acoustic Wave) filter, a dielectric filter or the like, and suppresses signals that exist in bands other than the desired band. However, the SAW filter or the dielectric filter cannot be incorporated into the semiconductor chip because of its configurations.

The radio signal processing circuit formed of separate components is typically formed in a super heterodyne system, and requires the SAW filter or the dielectric filter. However, they cannot be incorporated into the semiconductor chip. Accordingly, when the radio signal processing circuit manufactured by semiconductors is formed in a super heterodyne system, the SAW filter or the dielectric filter are attached to the external part of the semiconductor chip. This causes an increase in the number of components and an increase in the mounting area.

In order to solve these problems, a radio signal processing circuit system which does not require the SAW filter or the dielectric filter has been newly proposed. This system takes advantage of the semiconductor circuit that, while absolute values of component constants among semiconductor chips vary, relative values of the component constants in one semiconductor chip accord with each other with high accuracy. This system includes a zero-IF system and a low-IF system, for example. Both systems do not require the external SAW filter or dielectric filter and suppression of signals that exist in bands other than the desired band is performed by a filter that can be incorporated into a semiconductor. However, it may be required that a part of the filter is externally attached depending on the radio systems or system requirements.

See, for example, "Aarno Parssinen, "DIRECT CONVERSION RECEIVERS IN WIDE-BAND SYSTEMS", Kluwer Academic Publishers" for the basic principles of the zero-IF system or the low-IF system. The zero-IF system and the low-IF system have a common operational characteristic that one signal is decomposed into two components of an I component and a Q component for processing. The two local oscillator signals having the same frequency and phases different by 90 degrees and the radio signal received by the antenna or the like are input to an orthogonal mixer, whereby the radio signal received by the antenna or the like is decomposed into the I component and the Q component.

One mixer formed by elements that can be used as a switch even when a direct current bias current is not flowed includes a passive mixer. The elements that can be used as a switch even when the direct current bias current is not flowed includes a CMOS (Complementary Metal-Oxide Semiconductor), an FET (Field Effect Transistor) such as a JFET (Junction Field Effect Transistor), a MEMS (Micro Electromechanical Systems) switch and the like. The passive mixer is disclosed, for example, also in "Jing-Hong Conan Zhan et al., "A Broadband Low-Cost Direct-Conversion Receiver Front-End in 90 nm CMOS", IEEE JOURNAL OF SOLID-STATE CIRCUITS, 2008, VOL. 43, No. 5, pp. 1132-1137".

Figure 14:
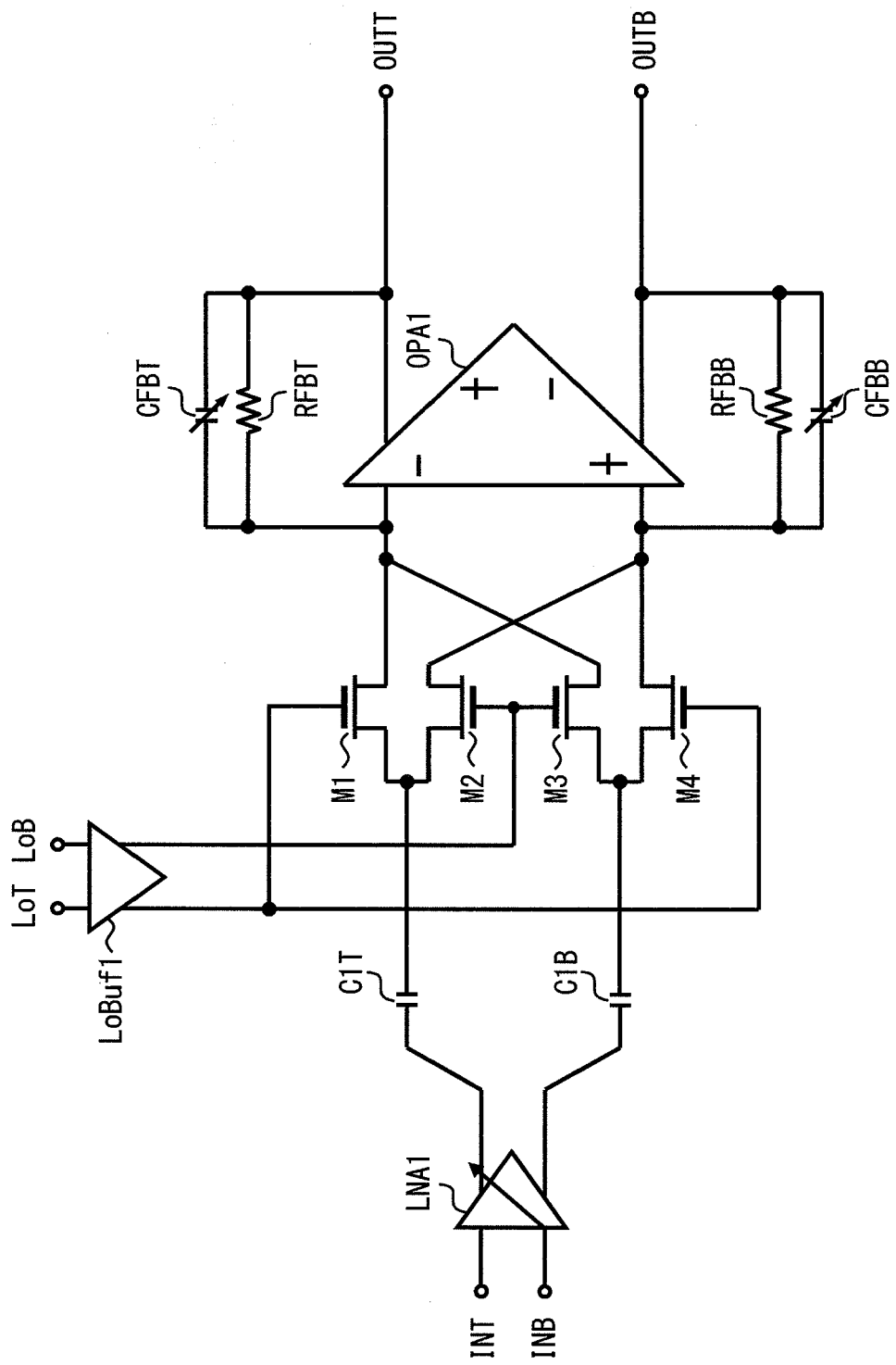
FIG. 14 is a diagram showing a configuration example of a semiconductor integrated circuit according to the concept before reaching the present invention.

Based on such semiconductor techniques, the present inventors have studied a radio signal processing circuit that includes a passive mixer, a low-noise amplification circuit, and a fully differential amplification circuit. FIG. 14 is a diagram showing a configuration example of a part of a radio signal processing circuit (hereinafter referred to as a semiconductor integrated circuit) according to the concept before reaching the present invention.

A semiconductor integrated circuit shown in FIG. 14 includes a low-noise amplification circuit LNA1, capacitance elements C1T and C1B, a local oscillator amplification circuit LoBuf1, MOSFETs (Metal-Oxide Semiconductor Field Effect Transistors: hereinafter simply referred to as transistors) M1-M4 forming a passive mixer, variable capacitance elements CFBT and CFBB, resistance elements RFBT and RFBB, and a fully differential amplification circuit OPA1. Description will be made here taking a case as an example in which all the transistors M1-M4 are N-channel MOSFETs. Further, the transistors M1-M4 each perform the same operation even when the source and the drain are switched. In the following description, the side connected to the fully differential amplification circuit OPA1 is assumed to be the drain.

A radio signal received by an antenna or a cable (not shown) from outside is converted into a balanced signal by an unbalanced/balanced conversion circuit, a SAW filter or the like, and the balanced signal is supplied to radio signal input terminals INT and INB via a matching circuit (not shown). The low-noise amplification circuit LNA1 amplifies the balanced signal supplied to the radio signal input terminals INT and INB without deteriorating the signal-to-noise ratio (SNR) as much as possible. A local oscillator balanced signal output from an oscillator circuit (not shown) is supplied to each of local oscillator input terminals LoT and LoB. The local oscillator amplification circuit LoBuf1 amplifies the local oscillator balanced signal supplied to each of the local oscillator input terminals LoT and LoB to power that is sufficient to switch the transistors M1-M4. Since the local oscillator balanced signal amplified by the local oscillator amplification circuit LoBuf1 is a balanced signal, the transistors M2 and M3 are OFF when the transistors M1 and M4 are ON, and the transistors M2 and M3 are ON when the transistors M1 and M4 are OFF.

A pair of amplification signals (first and second voltage signals) output from the low-noise amplification circuit LNA1 are supplied to the passive mixer via the capacitance elements C1T and C1B, respectively. More specifically, one of the pair of amplification signals output from the low-noise amplification circuit LNA1 is supplied to each source of the transistors M1 and M2 via the capacitance element C1T. The other one of the pair of amplification signals output from the low-noise amplification circuit LNA1 is supplied to each source of the transistors M3 and M4 via the capacitance element C1B.

One of the local oscillator balanced signals amplified by the local oscillator amplification circuit LoBuf1 is supplied to the gate of the transistor M1, and the other one of the local oscillator balanced signals amplified by the local oscillator amplification circuit LoBuf1 is supplied to the gate of the transistor M2. Further, the drain of the transistor M1 is connected to an inverting input terminal of the fully differential amplification circuit OPA1. The drain of the transistor M2 is connected to a non-inverting input terminal of the fully differential amplification circuit OPA1.

The other one of the local oscillator balanced signals amplified by the local oscillator amplification circuit LoBuf1 is supplied to the gate of the transistor M3, and one of the local oscillator balanced signals amplified by the local oscillator amplification circuit LoBuf1 is supplied to the gate of the transistor M4. Further, the drain of the transistor M3 is connected to the inverting input terminal of the fully differential amplification circuit OPA1. The drain of the transistor M4 is connected to the non-inverting input terminal of the fully differential amplification circuit OPA1.

The capacitance elements C1T and C1B are provided between the low-noise amplification circuit LNA1 and the transistors M1-M4 forming the passive mixer, and a direct current bias current is not supplied to the transistors M1-M4, thereby suppressing occurrence of the 1/f noise which is a function of the direct current bias current that flows through the MOSFETs.

This passive mixer outputs the sum of two current components of a difference frequency component of the radio signal and the local oscillator balanced signal and a sum frequency component of the radio signal and the local oscillator balanced signal. In the case of the direct conversion system, the frequency of the local oscillator balanced signal is set to the center frequency of a signal in a desired channel included in the radio signal received by the antenna or the like.

The resistance element RFBT and the variable capacitance element CFBT are provided in parallel between the non-inverting output terminal and the inverting input terminal of the fully differential amplification circuit OPA1. The resistance element RFBB and the variable capacitance element CFBB are provided in parallel between the inverting output terminal and the non-inverting input terminal of the fully differential amplification circuit OPA1. In short, the fully differential amplification circuit OPA1, the resistance elements RFBT and RFBB, and the variable capacitance elements CFBT and CFBB form a low-pass filter. Note that the resistance element RFBT feeds back an output signal (first amplification signal) of the non-inverting output terminal of the fully differential amplification circuit OPA1 to the inverting input terminal. The resistance element RFBB feeds back an output signal (second amplification signal) of the inverting output terminal of the fully differential amplification circuit OPA1 to the non-inverting input terminal.

This low-pass filter converts only the difference frequency component of the radio signal and the local oscillator balanced signal of the sum of the two current components output from the passive mixer into a voltage to output the voltage. A pair of output signals (first and second amplification signals) of this low-pass filter are supplied to a subsequent circuit via output terminals OUTT and OUTB.

Figure 15:
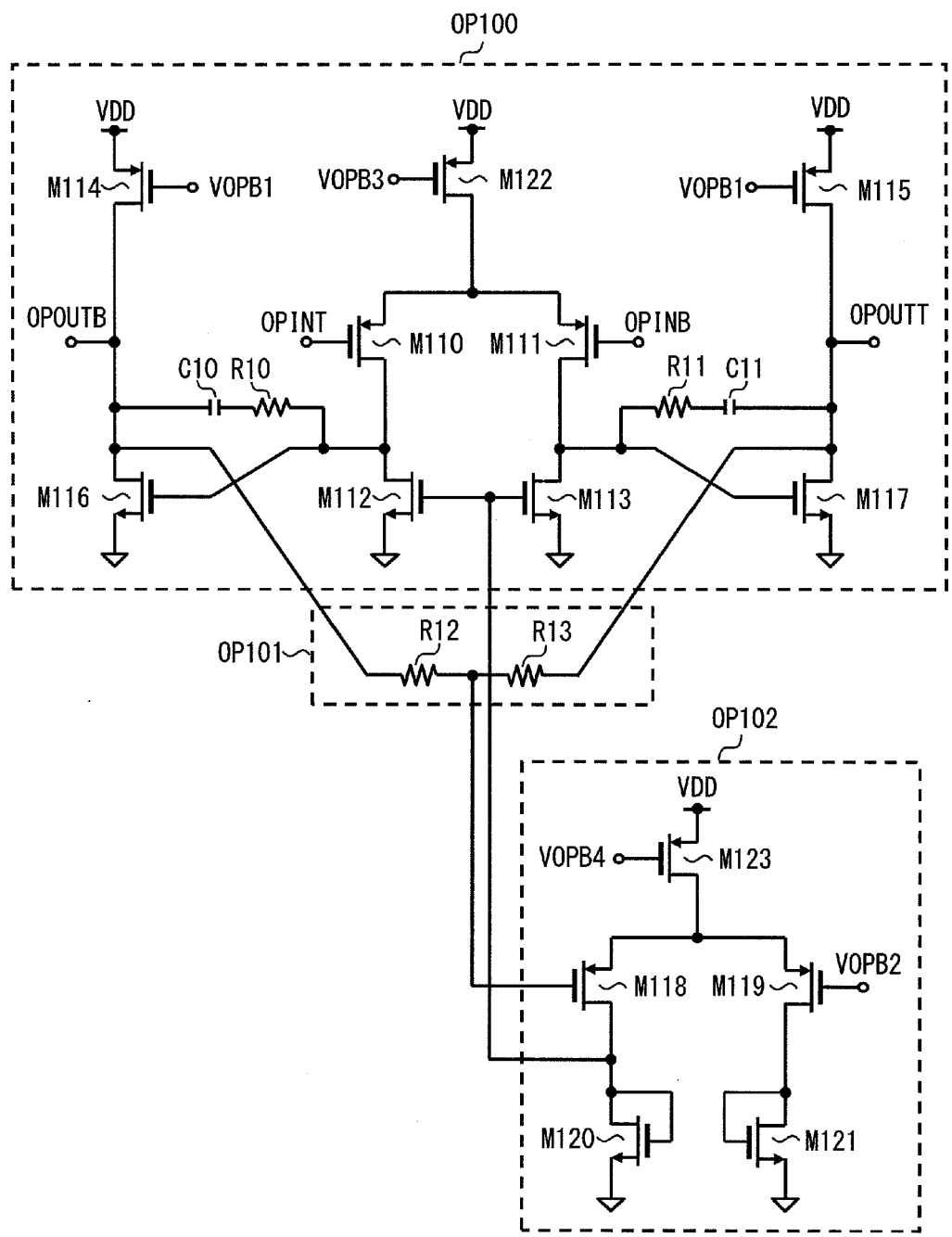
FIG. 15 is a diagram showing a specific configuration example of a fully differential amplification circuit provided in the semiconductor integrated circuit according to the concept before reaching the present invention.

FIG. 15 is a diagram showing a specific configuration example of the fully differential amplification circuit OPA1. The fully differential amplification circuit OPA1 shown in FIG. 15 includes a balanced signal amplifier OP100, a common-mode signal detection unit OP101, and a common-mode signal feedback unit OP102. The balanced signal amplifier OP100 includes transistors M110-M117 and M122, resistance elements R10 and R11, and capacitance elements C10 and C11. The common-mode signal detection unit OP101 includes resistance elements R12 and R13. The common-mode signal feedback unit OP102 includes transistors M118-M121 and M123. In the example shown in FIG. 15, the transistors M110, M111, M114, M115, M118, M119, M122, and M123 are P-channel MOSFETs, and the transistors M112, M113, M116, M117, M120, and M121 are N-channel MOSFETs. Further, a power supply voltage VDD from the high-potential side power supply is supplied to a power supply voltage terminal (hereinafter referred to as a power supply voltage terminal VDD).

When a bias voltage is applied to the gate of the transistor M122 via a bias voltage terminal VOPB3 from outside, a bias current starts to flow through the differential amplification circuit formed of the transistors M110-M113. Accordingly, only a balanced signal voltage component of an input signal voltage applied to each of a non-inverting input terminal (OPINT) and an inverting input terminal (OPINB) of the fully differential amplification circuit OPA1 is amplified.

Subsequently, when the bias voltage is applied to each of the gates of the transistors M114 and N115 via a bias voltage terminal VOPB1 from outside, the bias current starts to flow through the transistors M116 and M117. Then, a signal voltage (output voltage of the differential amplification circuit formed of the transistors M110-M113) applied to each gate of the transistors M116 and M117 is amplified, and is output outside from the non-inverting output terminal (OPOUTT) and the inverting input terminal (OPOUTB) of the fully differential amplification circuit OPA1 Note that the signal voltage applied to each gate of the transistors M116 and M117 has a common-mode signal voltage component suppressed by the differential amplification circuit formed of the transistors M110-M113, and mainly includes a balanced signal voltage component.

The resistance elements R10 and R11 and the capacitance elements C10 and C11 are added to stably operate the balanced signal amplifier OP100. Accordingly, the design is made so that, when the voltage gain of the balanced signal amplifier OP100 is 1 (0 dB), the phase on the basis of the input terminal OPINB of the input signal supplied to each of the input terminals OPINT and OPINB does not rotate from the phase on the basis of the output terminal OPOUTB of the output signal of each of the output terminals OPOUTT and OPOUTB by 180 degrees. For example, the design is made so that the phase delay is suppressed to about 115 degrees, whereby a stable amplification circuit can be obtained which does not oscillate even when the negative feedback is applied.

The common-mode signal detection unit OP101 detects a common-mode component of the output signal of each of the output terminals OPOUTT and OPOUTB by the resistance elements R12 and R13 having substantially the same resistance value.

In the common-mode signal feedback unit OP102, when a bias voltage is applied to the gate of the transistor M123 via a bias voltage terminal VOPB4 from outside, the bias current starts to flow through the differential amplification circuit formed of the transistors M118-M121. Note that a reference direct current voltage is applied to the gate of the transistor M119 from outside through a bias voltage terminal VOPB2.

The common-mode signal feedback unit OP102 compares the reference direct current voltage applied to the gate of the transistor M119 with the detection result of the common-mode signal detection unit OP101 applied to the gate of the transistor M118 (common-mode component of the output signal of each of the output terminals OPOUTT and OPOUTB). Then, the common-mode signal feedback unit OP102 applies the negative feedback to each gate of the transistors M112 and M113 based on the comparison result. In this way, the common-mode component of the output signal of each of the output terminals OPOUTT and OPOUTB of the fully differential amplification circuit OPA1 is controlled to be substantially equal to the reference direct current voltage.

Referring back to FIG. 14, description will be continued. As described above, the capacitance elements C1T and C1B are provided between the low-noise amplification circuit LNA1 and the transistors M1-M4 forming the passive mixer. Therefore, the output signal of the fully differential amplification circuit OPA1 is supplied via the resistance elements RFBT and RFBB as the bias voltage of the transistors M1-M4 and the bias voltage in the input side of the fully differential amplification circuit OPA1

Assume here that each voltage of the output terminals OPOUTT and OPOUTB is simultaneously increased to a voltage near the power supply voltage VDD for some reason. Here, the bias voltage is supplied via the resistance elements RFBB and RFBT to each gate of the transistors M110 and M111 provided in the fully differential amplification circuit OPA1, respectively. Therefore, the gate voltage of each of the transistors M110 and M111 increases to a voltage near the power supply voltage VDD according to an increase in the voltage of each of the output terminals OPOUTT and OPOUTB. This results in the stop of supply of the bias current to the differential amplification circuit formed of the transistors M110-M113. Accordingly, the voltage of each of the gates of the transistors M116 and M117 decreases to a voltage around the ground voltage. Then, the voltage of each of the output terminals OPOUTT and OPOUTB is close to the power supply voltage VDD. Specifically, the output signal of the fully differential amplification circuit OPA1 is made stable while maintaining the current state (i.e., the state in which the voltage is close to the power supply voltage VDD) or oscillates. In short, the fully differential amplification circuit OPA1 shown in FIG. 14 is not able to perform the normal amplification operation. In other words, the fully differential amplification circuit OPA1 shown in FIG. 14 is not able to return to the normal operation.

Figure 16:
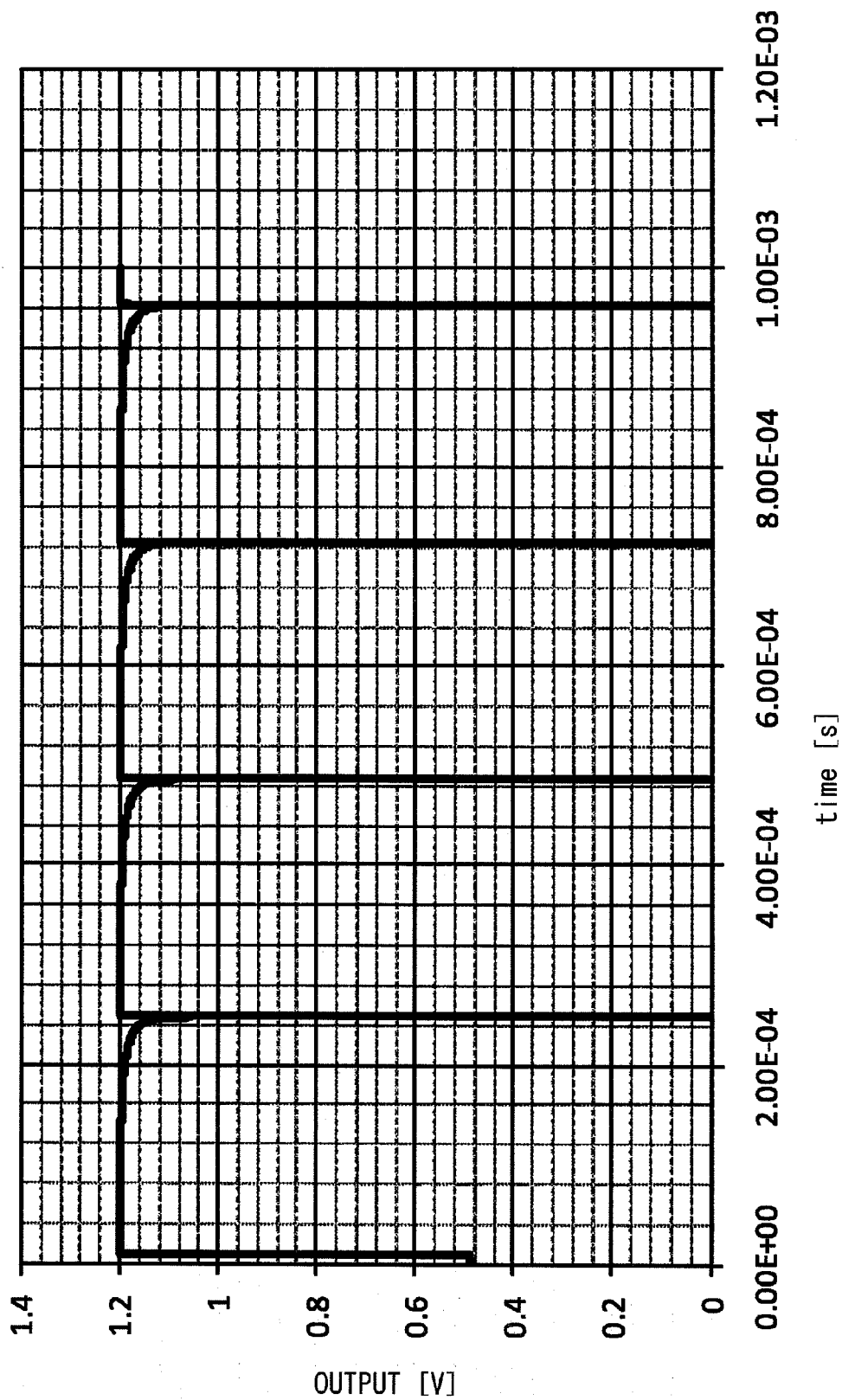
FIG. 16 is a diagram showing transient analysis simulation results of the semiconductor integrated circuit according to the concept before reaching the present invention.

FIG. 16 is a diagram showing transient analysis simulation results of each voltage of the output terminals OPOUTT and OPOUTB when each voltage of the output terminals OPOUTT and OPOUTB of the fully differential amplification circuit OPA1 is simultaneously increased to a voltage around the power supply voltage VDD in the semiconductor integrated circuit shown in FIG. 14. As a simulation condition, in the period until the elapse of 100 ns from time 10 us, each voltage of the output terminals OPOUTT and OPOUTB is increased to a voltage near the power supply voltage VDD. Note that the power supply voltage VDD is 1.2 V. Further, in order to reproduce the capacity coupling by the capacitance elements C1T and C1B, the input terminals OPINT and OPINB of the fully differential amplification circuit OPA1 are opened. Further, no signal is supplied from the low-noise amplification circuit LNA1 via the capacitance elements C1T and C1B to the subsequent circuit (fully differential amplification circuit OPA1).

As is clear from the simulation results of FIG. 16, each voltage of the output terminals OPOUTT and OPOUTB of the fully differential amplification circuit OPA goes up and down between the power supply voltage VDD and the ground voltage (GND), and is not in an appropriate bias state (in short, not stable in a predetermined voltage). In short, there is a problem in the semiconductor integrated circuit shown in FIG. 14 that, when the voltage in the input side of the fully differential amplification circuit OPA1 is temporarily varied unintentionally, it is impossible to return the fully differential amplification circuit OPA1 to the normal operation.

Hereinafter, with reference to the drawings, embodiments of the present invention will be described. Since the drawings are simplified, the technical scope of the present invention should not be narrowly interpreted based on the illustration of the drawings. Further, the same components are denoted by the same reference symbols, and overlapping description will be omitted.

First Embodiment

Figure 1B:
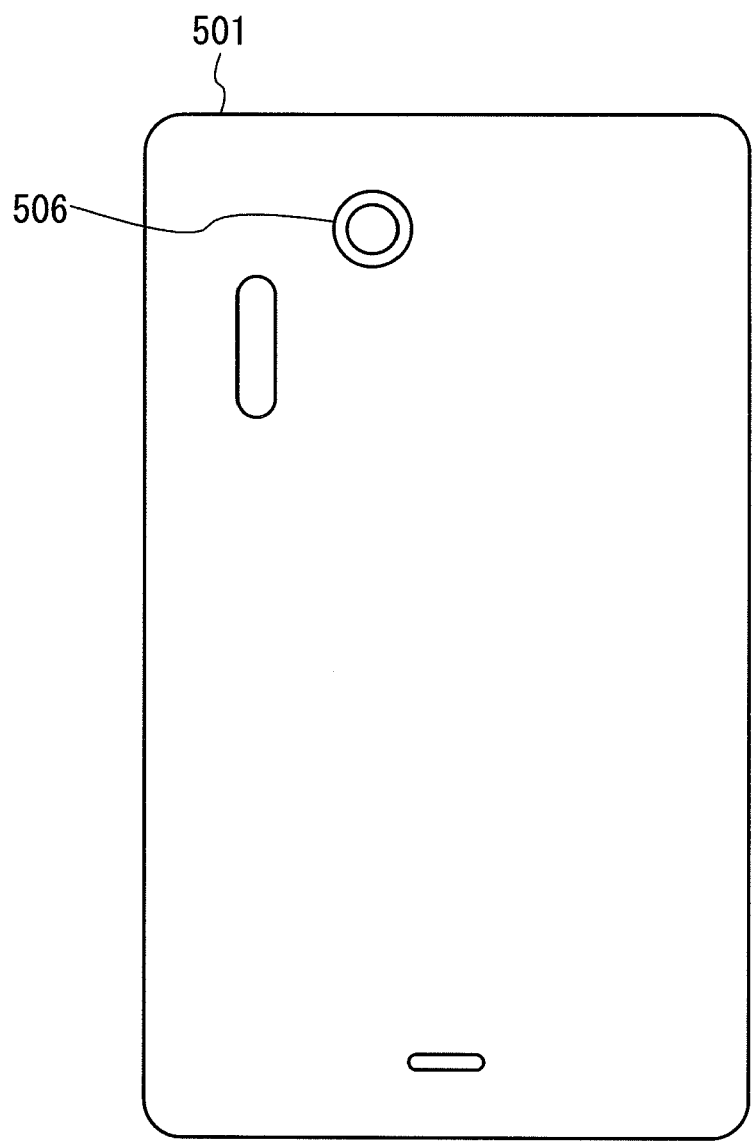
FIG. 1B is an external view showing one example of the radio communication terminal to which the present invention is applied.

First, with reference to FIGS. 1A and 1B, the outline of a radio communication terminal suitable as electronic equipment to which a semiconductor integrated circuit according to a first embodiment is applied will be described. FIGS. 1A and 1B are external views each showing a configuration example of a radio communication terminal 500. Shown in FIGS. 1A and 1B is a case in which the radio communication terminal 500 is a smartphone. However, the radio communication terminal 500 may be another radio communication terminal such as a future phone (e.g., folded-type mobile telephone terminal), a mobile game terminal, a tablet PC (Personal Computer), a notebook PC or the like. As a matter of course, the semiconductor integrated circuit according to the first embodiment may be applied to other devices than radio communication terminals.

FIG. 1A shows one main surface (front surface) of a case 501 forming the radio communication terminal 500. A display device 502, a touch panel 503, some operation buttons 504, and a camera device 505 are arranged on the front surface of the case 501. On the other hand, FIG. 1B shows the other main surface (rear surface) of the case 501. A camera device 506 is arranged on the rear surface of the case 501.

The display device 502 is an LCD (Liquid Crystal Display), an OLED (Organic Light-Emitting Diode) display or the like and is arranged so that the display surface is positioned on the front surface of the case 501. The touch panel 503 is arranged to cover the display surface of the display device 502, or arranged on the rear surface side of the display device 502, and detects the position on the display surface touched by a user. In summary, the user touches the display surface of the display device 502 by a finger, a dedicated pen (generally called a stylus) or the like, thereby being able to intuitively operate the radio communication terminal 500. Further, the operation buttons 504 are used to perform auxiliary operations of the radio communication terminal 500. Some radio communication terminals may not include such operation buttons.

The camera device 506 is a main camera whose lens unit is located on the rear surface of the case 501. On the other hand, the camera device 505 is a sub camera whose lens unit is located on the front surface of the case 501. Some radio communication terminals may not include such a sub camera.

Figure 2:
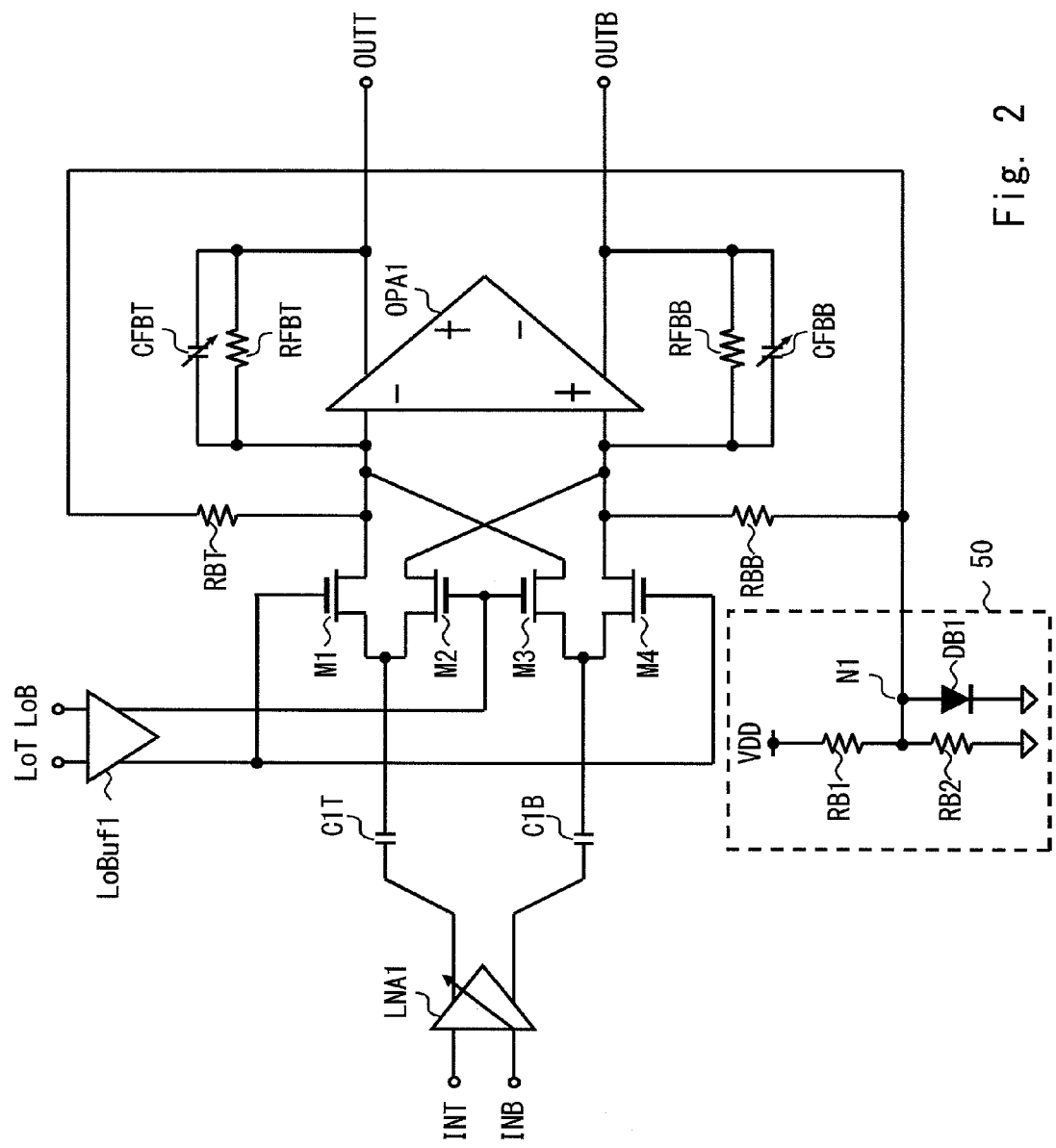
FIG. 2 is a diagram showing a configuration example of a semiconductor integrated circuit according to the first embodiment of the present invention.

FIG. 2 is a diagram showing a configuration example of a part of a radio signal processing circuit (hereinafter simply referred to as a semiconductor integrated circuit) according to the first embodiment of the present invention. The semiconductor integrated circuit according to the first embodiment includes a voltage generator that generates a predetermined voltage, and supplies the predetermined voltage to each input terminal of a fully differential amplification circuit OPA1 via resistance elements RBT and RBB. In this way, the semiconductor integrated circuit according to the first embodiment is able to supply a stable bias voltage to the input side of the fully differential amplification circuit OPA1 even when the voltage in the input side of the fully differential amplification circuit OPA1 is temporarily varied unintentionally. Thus, it is possible to promptly return the state of the fully differential amplification circuit OPA1 to the normal operation. The detail will be described below.

The semiconductor integrated circuit shown in FIG. 2 includes a low-noise amplification circuit LNA1, a capacitance element (first capacitance element) C1T, a capacitance element (second capacitance element) C1B, a local oscillator amplification circuit LoBuf1, transistors M1-M4 forming a passive mixer (mixer circuit), variable capacitance elements CFBT and CFBB, a resistance element (first resistance element) RFBT, a resistance element (second resistance element) RFBB, a fully differential amplification circuit (first amplification circuit) OPA1, a voltage generator 50, and resistance elements (third resistance element) RBT and RBB. While described in this embodiment as an example is a case in which the transistors M1-M4 are N-channel MOSFETs, it is not limited to this. For example, the transistors M1-M4 may be P-channel MOSFETs, or may have such a configuration in which P-channel MOSFETs and N-channel MOSFETs are connected in parallel. Further, the transistors M1-M4 may not be formed of MOSFETs, but may be formed of FETs such as JFETs or the like.

The configuration and the operation of the semiconductor integrated circuit shown in FIG. 2 is basically similar to those in the semiconductor integrated circuit shown in FIG. 14. Hereinafter, only the differences from the semiconductor integrated circuit shown in FIG. 14 will be mainly described.

The voltage generator 50 is a unit that generates a predetermined voltage VB. The voltage generator 50 includes a resistance element (fourth resistance element) RB1, a resistance element (fifth resistance element) RB2, and a diode DB1. The resistance elements RB1 and RB2 are arranged in series between a power supply voltage terminal VDD and a ground voltage terminal (hereinafter referred to as a ground voltage terminal GND) supplied with a ground voltage GND from a low potential side power supply. More specifically, the resistance element RB1 has one end connected to the power supply voltage terminal VDD and the other end connected to a node N1. The resistance element RB2 has one end connected to the node N1, and the other end connected to the ground voltage terminal GND. Further, the anode of the diode DB1 is connected to the node N1, and the cathode of the diode DB1 is connected to the ground voltage terminal GND. Then, the voltage generator 50 outputs a voltage of the node N1 as a predetermined voltage VB. Note that the predetermined voltage VB is preferably set to the voltage value which is substantially the same to a reference direct current voltage supplied to the fully differential amplification circuit OPA1.

The predetermined voltage VB (voltage of the node N1) generated by the voltage generator 50 can be expressed as the following formula (1).

$$VB = VDD \cdot RB2/(RB1+RB2) \quad (1)$$

In the formula (I), VB denotes a voltage value of the predetermined voltage VB, VDD denotes a voltage value of the power supply voltage VDD, RB1 denotes a resistance value of the resistance element RB1, and RB2 denotes a resistance value of the resistance element RB2.

The resistance element RBT is provided between the node N1 and an inverting input terminal of the fully differential amplification circuit OPA1. The resistance element RBB is provided between the node N1 and a non-inverting input terminal of the fully differential amplification circuit OPA1 In short, the predetermined voltage VB generated by the voltage generator 50 is supplied to the inverting input terminal of the fully differential amplification circuit OPA1 via the resistance element RBT, and is supplied to the non-inverting input terminal of the fully differential amplification circuit OPA1 via the resistance element RBB. In other words, the resistance element RBT transmits the predetermined voltage VB to the side of the inverting input terminal of the fully differential amplification circuit OPA1, and the resistance element RBB transmits the predetermined voltage VB to the side of the non-inverting input terminal of the fully differential amplification circuit OPA1 Description will be made taking a case as an example in which the resistance value of each of the resistance elements RBT and RBB is 2 kOhm. However, it is not limited to this, but may have another value which is relatively high. The other circuit configurations of the semiconductor integrated circuit shown in FIG. 2 are the same to those in the semiconductor integrated circuit shown in FIG. 14, and thus description will be omitted.

Figure 3:
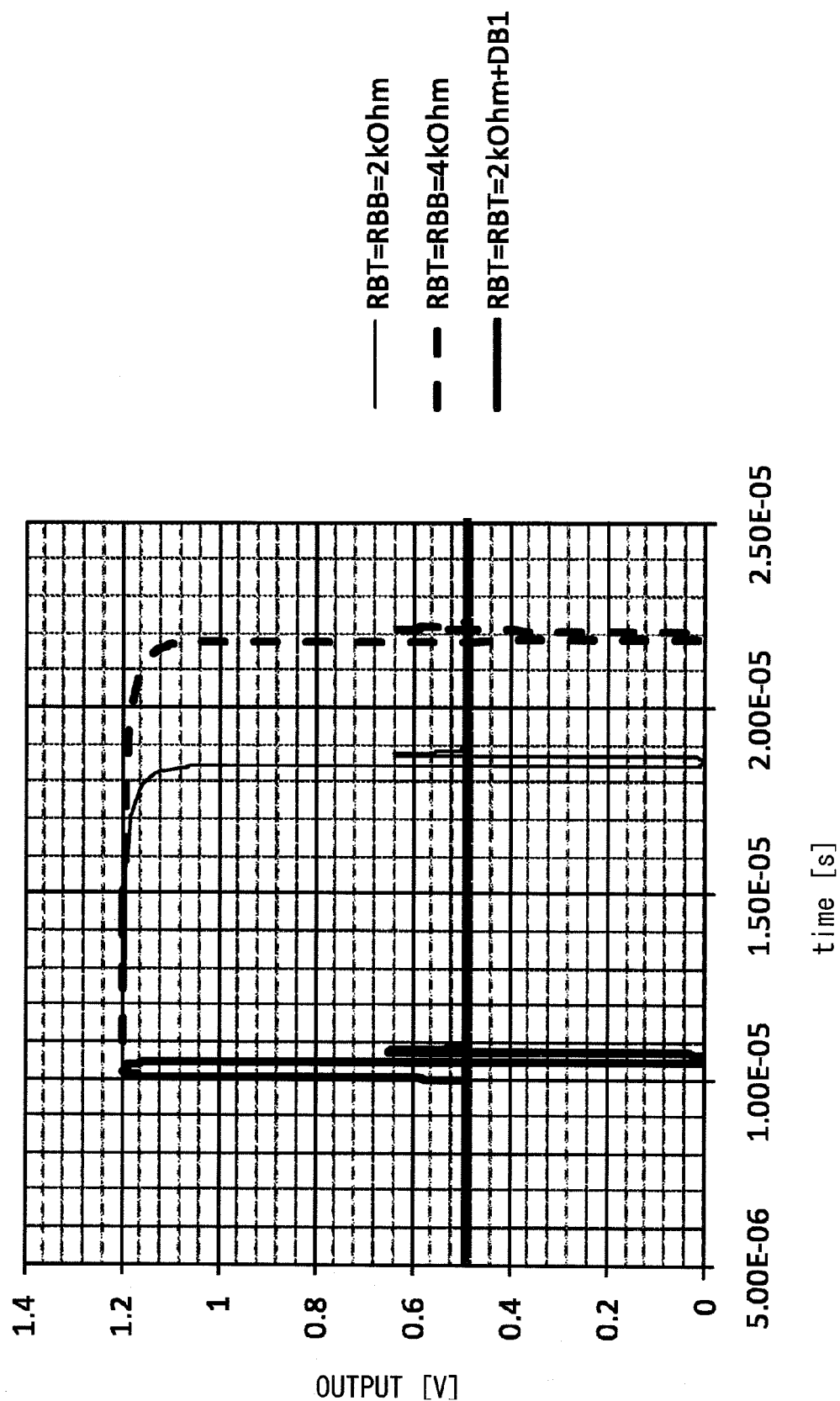
FIG. 3 is a diagram showing transient analysis simulation results of the semiconductor integrated circuit according to the first embodiment of the present invention.

FIG. 3 is a diagram showing transient analysis simulation results of each voltage of output terminals OPOUTT and OPOUTB when each voltage of the output terminals OPOUTT and OPOUTB of the fully differential amplification circuit OPA1 is simultaneously increased to a voltage around the power supply voltage VDD in the semiconductor integrated circuit shown in FIG. 2. As a simulation condition, as is similar to the case shown in FIG. 16, in the period until the elapse of 100 ns from time 10 us, each voltage of the output terminals OPOUTT and OPOUTB is increased to a voltage near the power supply voltage VDD. Note that the power supply voltage VDD is 1.2 V. Further, in order to reproduce the capacity coupling by the capacitance elements C1T and C1B, the input terminals OPINT and OPINE of the fully differential amplification circuit OPA1 are opened. In short, no signal is supplied from the low-noise amplification circuit LNA1 via the capacitance elements C1T and C1B to the subsequent circuit (fully differential amplification circuit OPA1).

In FIG. 3, the time range in the horizontal axis is narrower than that in the case shown in FIG. 16. Further, FIG. 3 also shows simulation results when the resistance values of the resistance elements RBT and RBB without providing the diode DB1 are 2 kOhm, and the resistance values of the resistance elements RBT and RBB without providing the diode DB1 are 4 kOhm in addition to the simulation results when the resistance values of the resistance elements RBT and RBB are 2 kOhm.

As is clear from the simulation results shown in FIG. 3, each voltage of the output terminals OPOUTT and OPOUTB of the fully differential amplification circuit OPA1 goes up and down once between the power supply voltage VDD and the ground voltage GND, and then become stable in about 0.5 V, which is a normal bias state here (in short, stable in a predetermined voltage).

Further, comparing the three kinds of simulation results shown in FIG. 3, the smaller the resistance values of the resistance elements RBT and RBB are, the faster they become stable in the normal bias state. Further, compared to the case in which the diode DB1 is not provided, the speed at which the resistance values become stable in the normal bias state is higher in the case in which the diode DB1 is provided.

If the resistances of the resistance elements RBT and RBB are made lower (e.g., several hundreds of Ohms) for the purpose of reducing the time until when the input of the fully differential amplification circuit OPA1 becomes stable in the normal bias state, the noise characteristics of the radio signal processing circuit is degraded or the mixer conversion gain is reduced. Accordingly, it is required that the resistances of the resistance elements RBT and RBB are high. When the resistances of the resistance elements RB1 and RB2 are reduced in order to solve this problem, power consumption increases. Therefore, by providing the diode DB1 instead of reducing the resistances of the resistance elements RB1 and RB2, time until when the input of the fully differential amplification circuit OPA1 becomes stable in the normal bias state can be efficiently reduced.

By setting the predetermined voltage VB (voltage of the node N1) to about 0.5 V, which is a voltage value lower than the forward voltage of the diode DB1, an increase in power consumption by the diode DB1 can be negligibly small. Accordingly, an increase in power consumption as the whole radio signal processing circuit is suppressed.

Note that the voltage generator generating the predetermined voltage VB is not limited to the configuration of the voltage generator 50 shown in FIG. 2. Hereinafter, another configuration example of the voltage generator that generates the predetermined voltage VB will be described.

Figure 4:
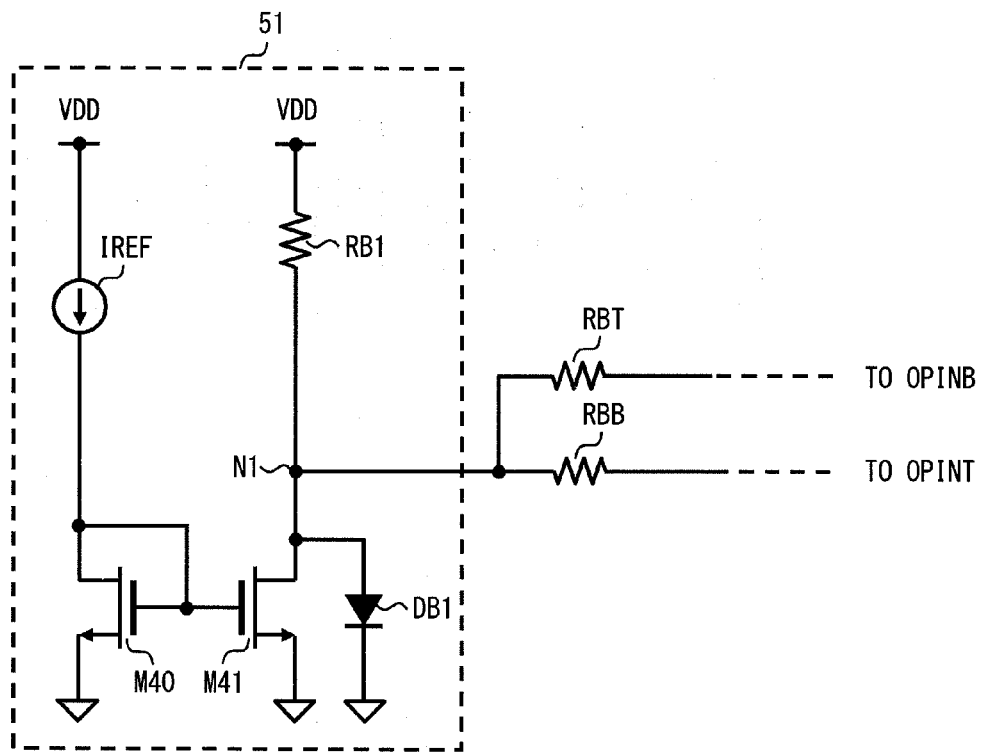
FIG. 4 is a diagram showing a variant example of a voltage generator according to the first embodiment of the present invention.

FIG. 4 is a diagram showing a configuration example of a voltage generator 51 which is a first variant example of the voltage generator 50. The voltage generator 51 shown in FIG. 4 includes a resistance element (fourth resistance element) RB1, a diode DB1, N-channel MOSFETs (hereinafter simply referred to as transistors) M40 and M41, and a constant current source IREF which flows a constant current. The transistors M40 and M41 and the constant current source IREF form a current generator.

An input terminal of the constant current source IREF is connected to a power supply voltage terminal VDD, and an output terminal of the constant current source IREF is connected to the drain and the gate of the transistor M40 and the gate of the transistor M41. The source of the transistor M40 is connected to a ground voltage terminal GND. The drain of the transistor M41 is connected to a node N1, and the source of the transistor M41 is connected to the ground voltage terminal GND. In short, the transistors M40 and M41 are connected as a current mirror. The resistance element RB1 has one end connected to the power supply voltage terminal VDD, and the other end connected to the node N1. The anode of the diode DB1 is connected to the node N1, and the cathode of the diode DB1 is connected to the ground voltage terminal GND. Then, the voltage generator 51 outputs the voltage of the node N1 as the predetermined voltage VB.

Figure 5:
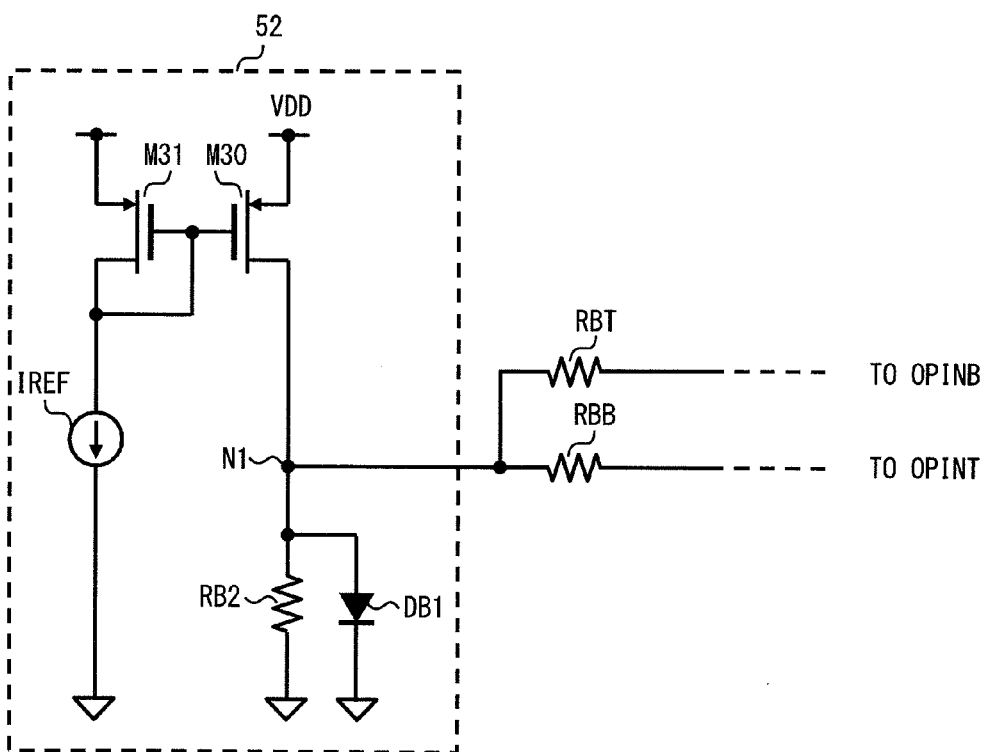
FIG. 5 is a diagram showing a variant example of the voltage generator according to the first embodiment of the present invention.

FIG. 5 is a diagram showing a configuration example of a voltage generator 52 which is a second variant example of the voltage generator 50. The voltage generator 52 shown in FIG. 5 includes a resistance element (fourth resistance element in this example) RB2, a diode DB1, P-channel MOSFETs (hereinafter simply referred to as transistors) M30 and M31, and a constant current source IREF which flows a constant current. The transistors M30 and M31 and the constant current source IREF form a current generator.

An input terminal of the constant current source IREF is connected to the drain and the gate of the transistor M31 and the gate of the transistor M30, and an output terminal of the constant current source IREF is connected to a ground voltage terminal GND. The source of the transistor M31 is connected to a power supply voltage terminal VDD. The drain of the transistor M30 is connected to a node N1, and the source of the transistor M30 is connected to the power supply voltage terminal VDD. In short, the transistors M30 and M31 are connected as a current mirror. The resistance element RB2 has one end connected to the node N1, and the other end connected to the ground voltage terminal GND. The anode of the diode DB1 is connected to the node N1, and the cathode of the diode DB1 is connected to the ground voltage terminal GND. Then, the voltage generator 52 outputs the voltage of the node N1 as the predetermined voltage VB.

Figure 6:
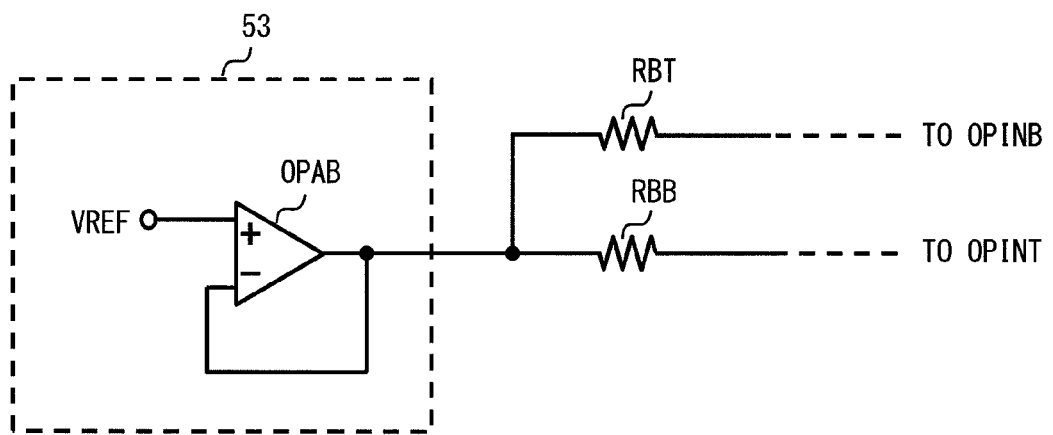
FIG. 6 is a diagram showing a variant example of the voltage generator according to the first embodiment of the present invention.

FIG. 6 is a diagram showing a configuration example of a voltage generation circuit 53 which is a third variant example of the voltage generator 50. The voltage generator 53 shown in FIG. 6 includes an operation amplification circuit (second amplification circuit) OPAB. A reference voltage Vref is supplied to the non-inverting input terminal of the operation amplification circuit OPAB, and an output signal of the operation amplification circuit OPAB is fed back and supplied to the inverting input terminal of the operation amplification circuit OPAB. Then, the voltage generator 53 outputs the output signal of the operation amplification circuit OPAB as the predetermined voltage VB.

In the voltage generator 53 shown in FIG. 6, an output impedance of the operation amplification circuit OPAB is low. Thus, there is no need to provide the diode DB1. However, it should be noted that, since the operation amplification circuit OPAB is provided in the voltage generator 53 shown in FIG. 6, power consumption here is larger than that in other voltage generators.

Needless to say, the voltage generator that generates the predetermined voltage VB is not limited to those described above, but may be changed as appropriate to another circuit configuration that achieves the same effects.

Described in the first embodiment is the case in which the predetermined voltage VB generated by the voltage generator is 0.5 V. However, it is not limited to this example. The predetermined voltage VB generated by the voltage generator may be set to other voltage values than 0.5 V by the power supply voltage VDD and the signal dynamic range design. For example, when the predetermined voltage VB is desired to be set to 1.2 V, a diode DB2 may be added, which may be connected to the diode DB1 in series, for example.

Figure 7:
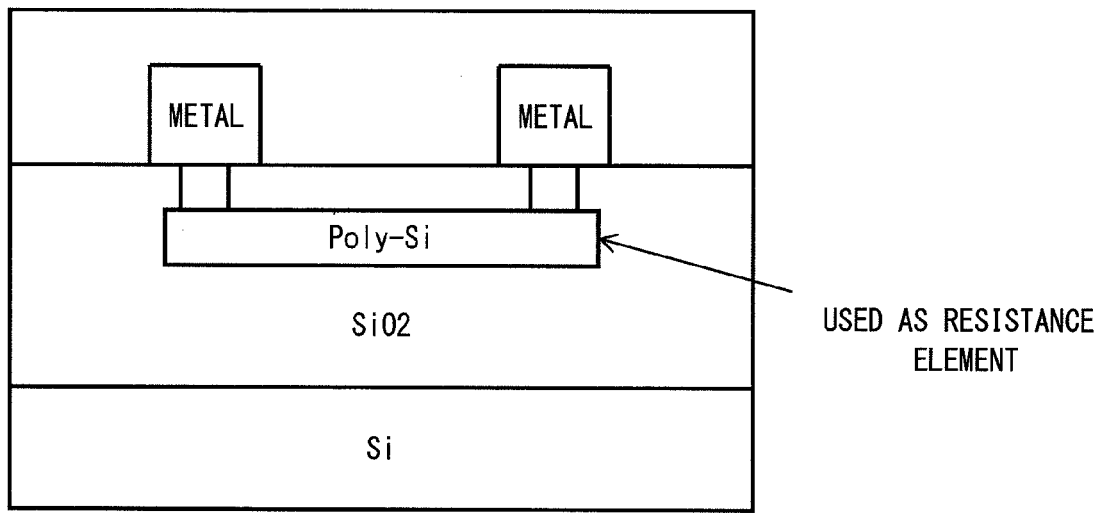
FIG. 7 is a cross-sectional view showing one example of resistance elements RBT and RBB.

Polycrystalline silicon (Poly-Si) having a structure as shown in a cross-sectional view in FIG. 7 may be used, for example, as the resistance elements RBT and RBB. As shown in the cross-sectional view in FIG. 7, the resistance element formed of polycrystalline silicon is formed at a position away from a Si substrate SUB via a silicon oxide film (SiO2) which is an insulator. Alternatively, a diffused resistor or the like may be used as the resistance elements RBT and RBB.

Figure 8:
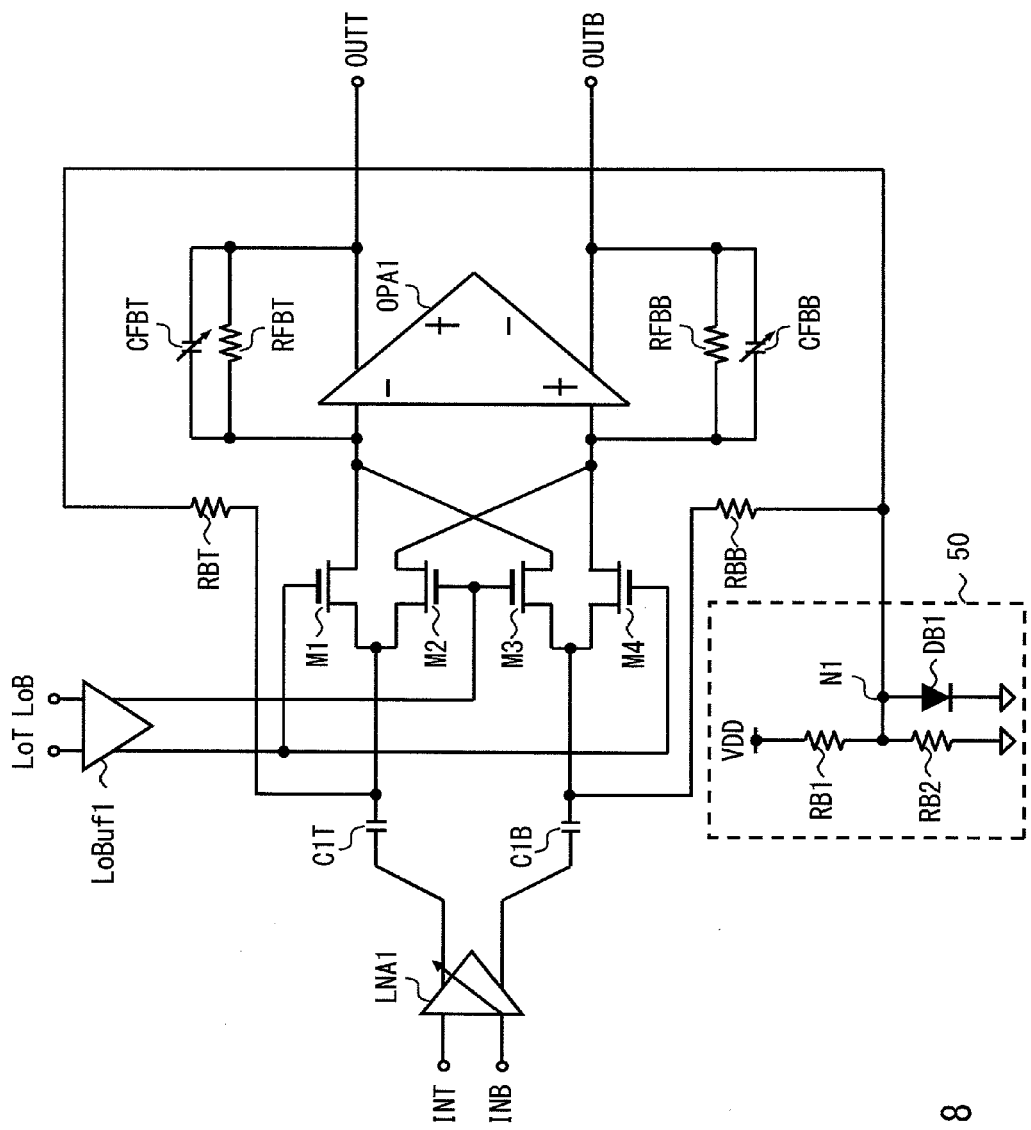
FIG. 8 is a diagram showing a variant example of the semiconductor integrated circuit according to the first embodiment of the present invention.

Next, a variant example of the semiconductor integrated circuit shown in FIG. 2 will be described. FIG. 8 is a diagram showing the variant example of the semiconductor integrated circuit shown in FIG. 2. Compared with the semiconductor integrated circuit shown in FIG. 2, the connection relation between the resistance elements RBT and RBB is different in the semiconductor integrated circuit shown in FIG. 8. Specifically, the resistance element RBT has one end connected to the node N1, and the other end connected to a node on a signal line that connects the capacitance element C1T and the passive mixer. The resistance element RBB has one end connected to the node N1, and the other end connected to a node on a signal line that connects the capacitance element C1B and the passive mixer. The other circuit configuration and the operation of the semiconductor integrated circuit shown in FIG. 8 are similar to those in the semiconductor integrated circuit shown in FIG. 2, and thus description thereof will be omitted.

The semiconductor integrated circuit shown in FIG. 8 is basically able to achieve the same effects as the semiconductor integrated circuit shown in FIG. 2. However, judging from the simulation results and the like in FIG. 3, the time until when the input of the fully differential amplification circuit OPA1 becomes stable in the normal bias state may be increased by the amount of on-resistances of the transistors M1-M4 forming the passive mixer. Further, when there is a difference, variation or the like in design values between the input common-mode voltage and the output common-mode voltage of the fully differential amplification circuit OPA1, a direct current bias current flows through the transistors M1-M4, which may cause degradation of the 1/f noise characteristics. However, if such a problem does not cause serious effects according to its application, even the configuration such as the semiconductor integrated circuit shown in FIG. 8 can achieve sufficient effects.

(Comparison with Related Arts)

Means for supplying a bias voltage to an input side of a fully differential amplification circuit includes, for example, means disclosed in Soundarapandian Karthikeyan et al., "Low-Voltage Analog Circuit Design Based on Biased Inverting Opamp Configuration", IEEE JOURNAL OF SOLID-STATE CIRCUITS, 2000, VOL. 47, No. 3, pp. 176-184 (see FIG. 5 in the literature). However, the configuration according to this related art is to supply the bias voltage in the input side of the fully differential amplification circuit which is performing a normal operation with high accuracy, and is not to supply the bias voltage only when there occurs an abnormality such as a case in which each voltage in an output side of the fully differential amplification circuit is simultaneously increased to around the power supply voltage VDD. Further, the configuration in the related art additionally requires an operation amplification circuit, which increases the size of the circuit and power consumption. Meanwhile, according to the semiconductor integrated circuit of the present invention, when each voltage in the input side of the fully differential amplification circuit OPA1 is temporarily varied unintentionally, it is possible to return the state of the fully differential amplification circuit OPA1 to the normal operation more promptly than the case in the related art.

Second Embodiment

Figure 9:
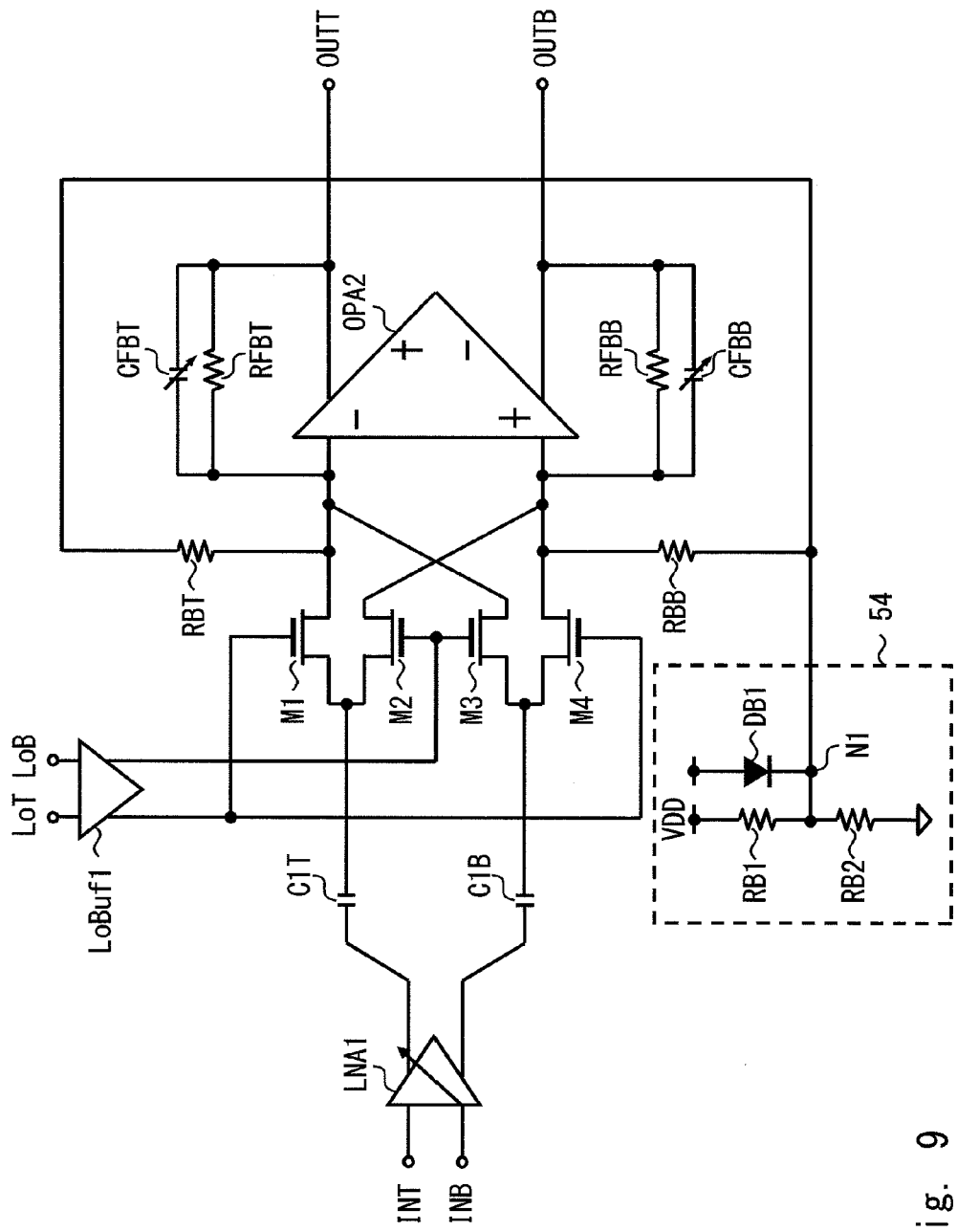
FIG. 9 is a diagram showing a configuration example of a semiconductor integrated circuit according to a second embodiment of the present invention.

FIG. 9 is a diagram showing a configuration example of a part of a radio signal processing circuit (hereinafter simply referred to as a semiconductor integrated circuit) according to a second embodiment of the present invention. As is different from the semiconductor integrated circuit shown in FIG. 2, the semiconductor integrated circuit shown in FIG. 9 includes a fully differential amplification circuit OPA2 in place of the fully differential amplification circuit OPA1, and includes a voltage generator 54 in place of the voltage generator 50.

Figure 10:
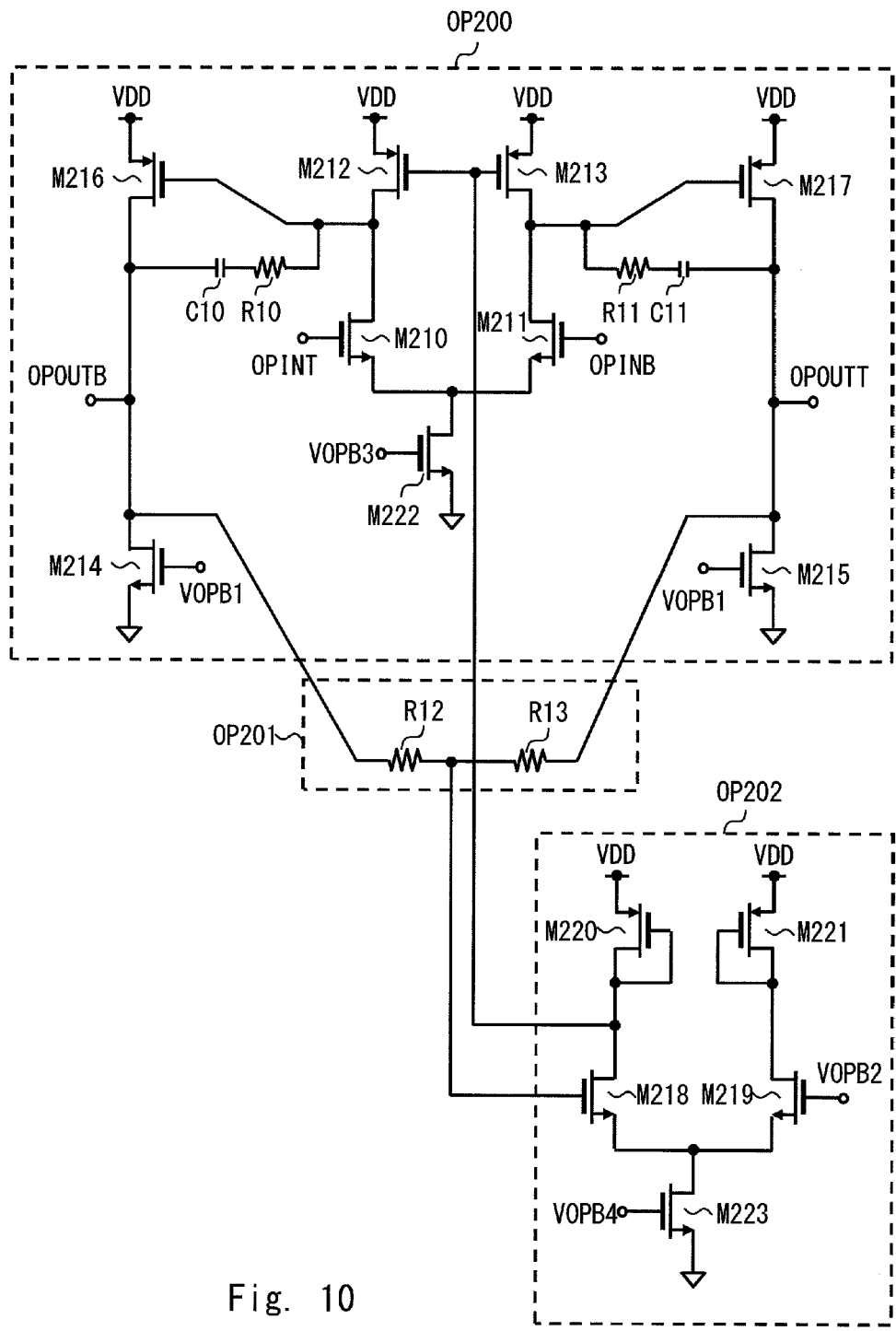
FIG. 10 is a diagram showing a specific configuration example of a fully differential amplification circuit provided in the semiconductor integrated circuit according to the second embodiment of the present invention.

FIG. 10 is a diagram showing a specific configuration example of the fully differential amplification circuit OPA2 provided in the semiconductor integrated circuit shown in FIG. 9. The fully differential amplification circuit OPA2 shown in FIG. 10 includes a balanced signal amplifier OP200, a common-mode signal detection unit OP201, and a common-mode signal feedback unit OP202. The balanced signal amplifier OP200 includes transistors M210-M217 and M222, resistance elements R10 and R11, and capacitance elements C10 and C11. The common-mode signal detection unit OP201 includes resistance elements R12 and R13. The common-mode signal feedback unit OP202 includes transistors M218-M221 and M223. In the example shown in FIG. 10, the transistors M210, M211, M214, M215, M218, M219, M222, and M223 are N-channel MOSFETs, and the transistors M212, M213, M216, M217, M220, and M221 are P-channel MOSFETs. The transistors M210-M223 correspond to the transistors M110-M123 shown in FIG. 15, respectively.

Now, the fully differential amplification circuit OPA2 shown in FIG. 10 is different from the fully differential amplification circuit OPA1 shown in FIG. 15 in that the polarity of the carrier of each transistor is reversed, and the connection destination of the power supply voltage terminal VDD and the ground voltage terminal GND is reversed.

Referring back to FIG. 9, description will be continued. The voltage generator 54 includes resistance elements RB1 and RB2 and a diode DB1, as is similar to the voltage generator 50. Now, the anode of the diode DB1 is connected to a power supply voltage terminal VDD, and the cathode of the diode DB1 is connected to a node N1.

In the configuration of the semiconductor integrated circuit shown in FIG. 9, when each voltage of the output terminals OPOUTT and OPOUTB of the fully differential amplification circuit OPA2 is simultaneously reduced to a voltage near the ground voltage GND, the bias voltage to the input side of the fully differential amplification circuit OPA becomes unstable. Therefore, the diode DB1 is provided between the power supply voltage VDD and the node N1 in the voltage generator 54, whereby the voltage generation unit 54 is able to supply a stable predetermined voltage VB to the input side of the fully differential amplification circuit OPA2.

Third Embodiment

Figure 11:
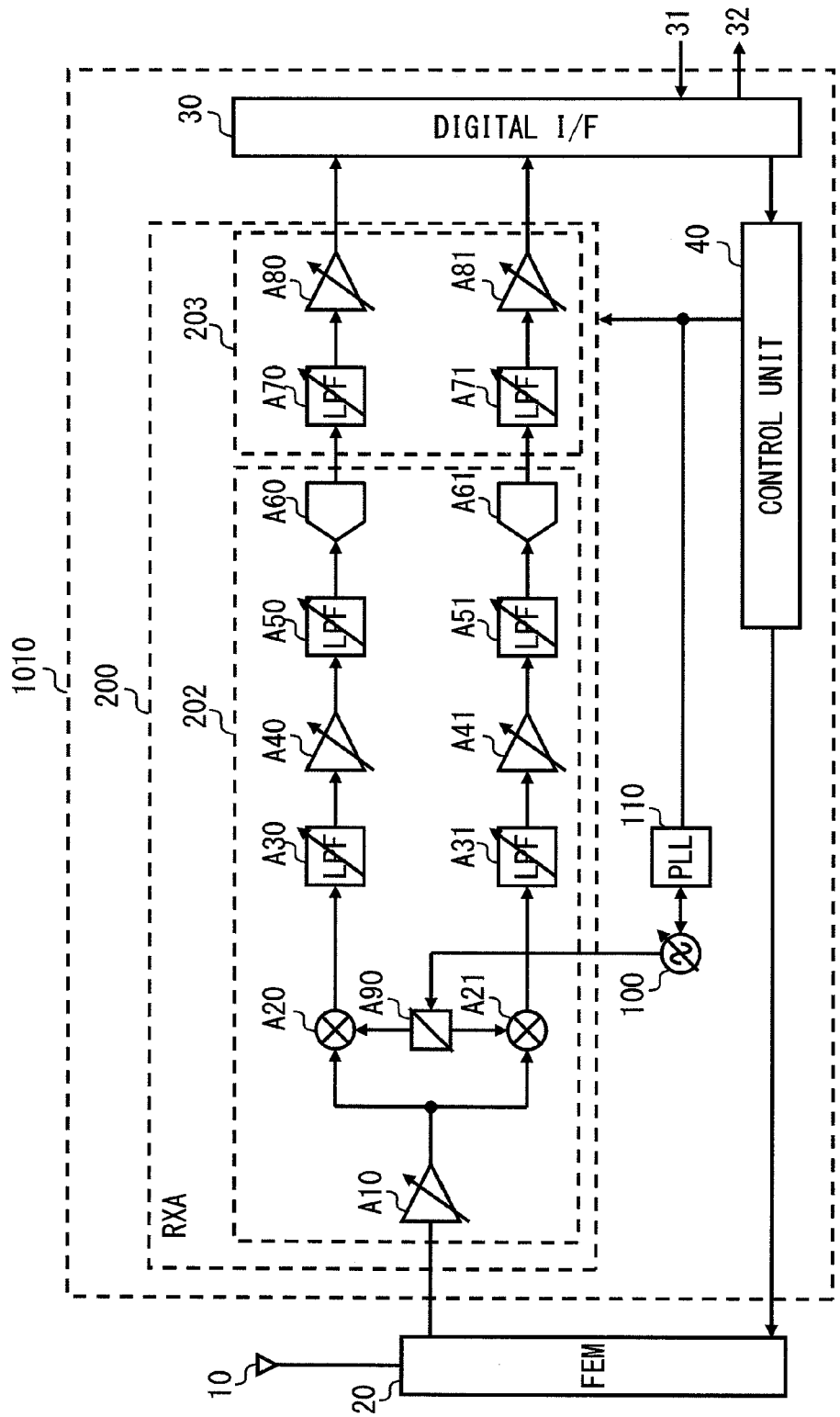
FIG. 11 is a block diagram showing a reception apparatus according to a third embodiment of the present invention.

In a third embodiment, an example in which the semiconductor integrated circuit shown in FIG. 2 is applied to a reception apparatus will be described. FIG. 11 is a block diagram showing a configuration example of the reception apparatus according to the third embodiment.

A reception apparatus (RXA) 200 shown in FIG. 11 is provided on a semiconductor chip 1010 used as a radio signal processing circuit. In addition, a digital interface circuit (digital I/F) 30, a control unit 40, a voltage controlled oscillator (hereinafter simply referred to as a VCO) 100, and a frequency synthesizer (hereinafter simply referred to as a PLL) 110 are at least provided on the semiconductor chip 1010. Further, an antenna 10 and a front end module (FEM) 20 are provided outside the semiconductor chip 1010.

The reception apparatus 200 shown in FIG. 11 includes an analog processor 202 and a digital processor 203. The analog processor 202 includes a low-noise amplification circuit A10, mixer units A20 and A21, variable analog low-pass filters (LPFs) A30, A31, A50, and A51, analog variable amplifiers A40 and A41, analog digital converters A60 and A61, and a phase shifter A90. The digital processor 203 includes variable digital low-pass filters (LPFs) A70 and A71, and digital variable amplifiers A80 and A81. The reception apparatus 200 is a reception apparatus in which a so-called direct conversion system is employed. Note that a set of the mixer unit A20 and the low-noise amplification circuit A10 that is provided at the previous stage of the mixer unit A20, and a set of the mixer unit A21 and the low-noise amplification circuit A10 that is provided at the previous stage of the mixer unit A21 each correspond to the semiconductor integrated circuit shown in FIG. 2.

Subsequently, operations of the reception apparatus 200 and peripheral circuits shown in FIG. 11 will be described. The semiconductor chip 1010 is controlled by a baseband LSI (Large Scale integrated Circuit) (not shown) through the digital interface circuit 30. The third embodiment will be described taking a case as an example in which serial digital signals are transmitted or received between the digital interface circuit 30 and the baseband LSI. Further, the third embodiment will be described taking a case as an example in which each of the digital variable amplifiers A80 and A81 provided in the digital processor 203 outputs a parallel digital signal (digital parallel signal). In this case, the digital interface circuit 30 includes a function of converting the digital parallel signal into a serial signal, and transmits the serial signal that is obtained to the baseband LSI as a transmission signal 32.

If the digital variable amplifiers A80 and A81 provided in the digital processor 203 have such a configuration as to output a serial digital signal, the digital interface circuit 30 need not have a function of converting the signal into the serial signal stated above.

The digital interface circuit 30 receives a signal transmitted from the baseband LSI (not shown) as a reception signal 31. Then, the control unit 40 outputs a control signal to control the semiconductor chip 1010 or the front end module 20, data to a circuit (not shown) in the semiconductor chip 1010 and the like based on the reception signal 31 that is received via the digital interface circuit 30.

Further, the digital interface circuit 30 transmits a signal received from the semiconductor chip 1010, states of the semiconductor chip 1010 and the front end module 20 and the like to the baseband LSI as the transmission signal 32. In the third embodiment, as stated above, serial digital signals are transmitted or received between the digital interface circuit 30 and the baseband LSI. Therefore, the number of pins of the semiconductor chip 1010 can be reduced compared to a case in which parallel digital signals are transmitted or received between the digital interface circuit 30 and the baseband LSI.

As a result, it is possible to reduce the size of the semiconductor package on which the semiconductor chip is mounted.

The radio signal received by the antenna 10 is supplied to the front end module 20. The front end module 20 at least includes a band-pass filter. This band-pass filter outputs the signal to the low-noise amplification circuit A10 so as to minimize the loss of a signal in a desired band as much as possible while suppressing the signals other than the signal in the desired band among the signals included in the radio signal.

The low-noise amplification circuit A10 amplifies the output signal from the front end module 20 by a desired gain without deteriorating the signal-to-noise ratio (SNR) as much as possible. The output signal from the low-noise amplification circuit A10 is equally divided into two, and then supplied to the mixer units A20 and S21.

Meanwhile, the PLL 110 locks the frequency of the oscillator signal of the VCO 100 to a desired frequency based on setting information from the control unit 40. Accordingly, the VCO 100 outputs an oscillator signal of desired frequency.

The phase shifter A90 generates a local oscillator signal in which the phase of the oscillator signal from the VCO 100 is shifted by 90 degrees to output the local oscillator signal to the mixer unit A20, and generates a local oscillator signal in which the phase of the oscillator signal from the VCO 100 is not shifted to output the local oscillator signal to the mixer unit A21. In short, local oscillator signals having a phase difference of 90 degrees are supplied to the mixer units A20 and A21.

As described above, the reception apparatus 200 employs the direct conversion system. Accordingly, the frequency of the local oscillator signal supplied to each of the mixer units A20 and A21 is set to the center frequency of the signal of the desired channel included in the radio signal received by the antenna 10.

Note that the phase shifter A90 does not necessarily output the local oscillator signal having the same frequency as that of the oscillator signal of the VCO 100. For example, the phase shifter A90 may have a configuration of outputting a local oscillator signal having half the frequency of that of the oscillator signal of the VCO 100. In this case, the phase shifter A90 has a function of dividing the oscillator signal of the VCO 100 into two.

The mixer units A20 and A21 perform the same operations as the passive mixer and the fully differential amplification circuit OPA1 shown in FIG. 2. In short, the mixer units A20 and A21 convert only the difference frequency component between the radio signal and the local oscillator signal among the difference frequency component between the radio signal and the local oscillator signal and the sum frequency component between the radio signal and the local oscillator signal to a voltage, and output the voltage to the variable analog low-pass filters A30 and A31, respectively.

The variable analog low-pass filters A30 and A31 output signals to the analog variable amplifiers A40 and A41, respectively, so as to minimize the loss of the signal in the desired band as much as possible while suppressing the signals other than the signal in the desired band among the signals included in the output signals from the mixer units A20 and A21.

The analog variable amplifiers A40 and A41 amplify the output signals from the variable analog low-pass filters A30 and A31 by the gain according to the setting information from the control unit 40, respectively, and output the amplified signals to the variable analog low-pass filters A50 and A51, respectively.

The variable analog low-pass filters A50 and A51 output signals to the analog digital converters A60 and A61, respectively, so as to minimize the loss of the signal in the desired band as much as possible while suppressing the signals other than the signal in the desired band among the signals included in the output signals from the analog variable amplifiers A40 and A41, respectively.

The analog digital converters A60 and A61 respectively convert the analog signals output from the variable analog low-pass filters A50 and A51 to digital signals.

In the digital processor 203, the variable digital low-pass filters A70 and A71 output signals to the digital variable amplifiers A80 and A81, respectively, so as to minimize the loss of the signal in the desired band as much as possible while suppressing the signals other than the signal in the desired band among the signals included in the output signals (digital signals) from the analog digital converters A60 and A61, respectively.

The digital variable amplifiers A80 and A81 amplify the output signals from the variable digital low-pass filters A70 and A71, respectively, by the gain according to the setting information from the control unit 40, to output the amplified signals to the digital interface circuit 30. Then, the digital interface circuit 30 converts the output signals from the digital variable amplifiers A80 and A81 to serial signals as necessary, as described above, to transmit the converted signals to the baseband LSI (not shown) as the transmission signal 32.

(Specific Configuration Examples of Mixer Units A20 and A21)

Figure 12:
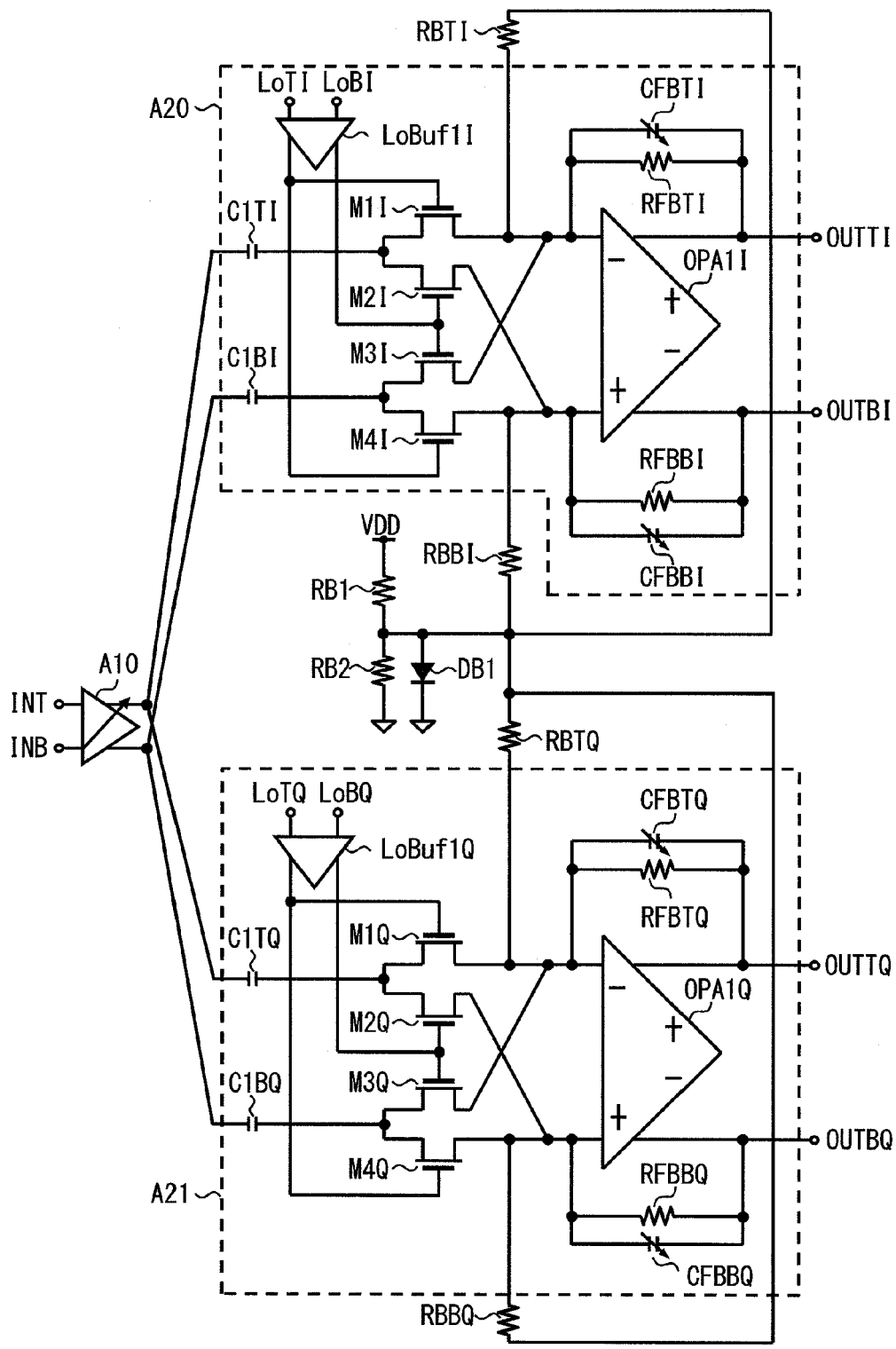
FIG. 12 is a diagram showing a configuration example of a mixer unit provided in the reception apparatus and peripheral circuits according to the third embodiment of the present invention.

FIG. 12 is a diagram showing a specific configuration example of the mixer units A20 and A21. FIG. 12 also shows a low-noise amplification circuit A10 provided at a previous stage of the mixer units A20 and A21.

The mixer unit A20 includes capacitance elements C1TI and C1BI, a local oscillator amplification circuit LoBuf1I, transistors M1I-M4I forming a passive mixer, variable capacitance elements CFBTI and CFBBI, resistance elements RFBTI and RFBBI, and a fully differential amplification circuit OPA1I. Note that, for the symbols of the components identical to the components in the semiconductor integrated circuit shown in FIG. 2, the symbols with "I" attached to the ends of the symbols of the corresponding components in the semiconductor integrated circuit shown in FIG. 2 are used.

The mixer unit A21 includes capacitance elements C1TQ and C1BQ, a local oscillator amplification circuit LoBuf1Q, transistors M1Q-M4Q forming a passive mixer, variable capacitance elements CFBTQ and CFBBQ, resistance elements RFBTQ and RFBBQ, and a fully differential amplification circuit OPA1Q. Note that, for the symbols of the components identical to the components in the semiconductor integrated circuit shown in FIG. 2, the symbols with "Q" attached to the ends of the symbols of the corresponding components in the semiconductor integrated circuit shown in FIG. 2 are used.

Further, resistance elements RBTI and RBBI (corresponding to the resistance elements RBT and RBB in FIG. 2) are added to the mixer unit A20. Resistance elements RBTQ and RBBQ (corresponding to the resistance elements RBT and RBB in FIG. 2) are added to the mixer unit A21. Then, a voltage generator (corresponding to the voltage generator 50 in FIG. 2) including resistance elements RB1 and RB2 and a diode DB1 is commonly added to the mixer units A20 and A21.

In this way, the semiconductor integrated circuit shown in FIG. 2 may also be applied to the reception apparatus that receives radio signals. Needless to say, the variant example of the semiconductor integrated circuit shown in FIG. 2 (e.g., semiconductor integrated circuit or the like shown in FIG. 8) may also be applied to the reception apparatus.

Fourth Embodiment

Figure 13:
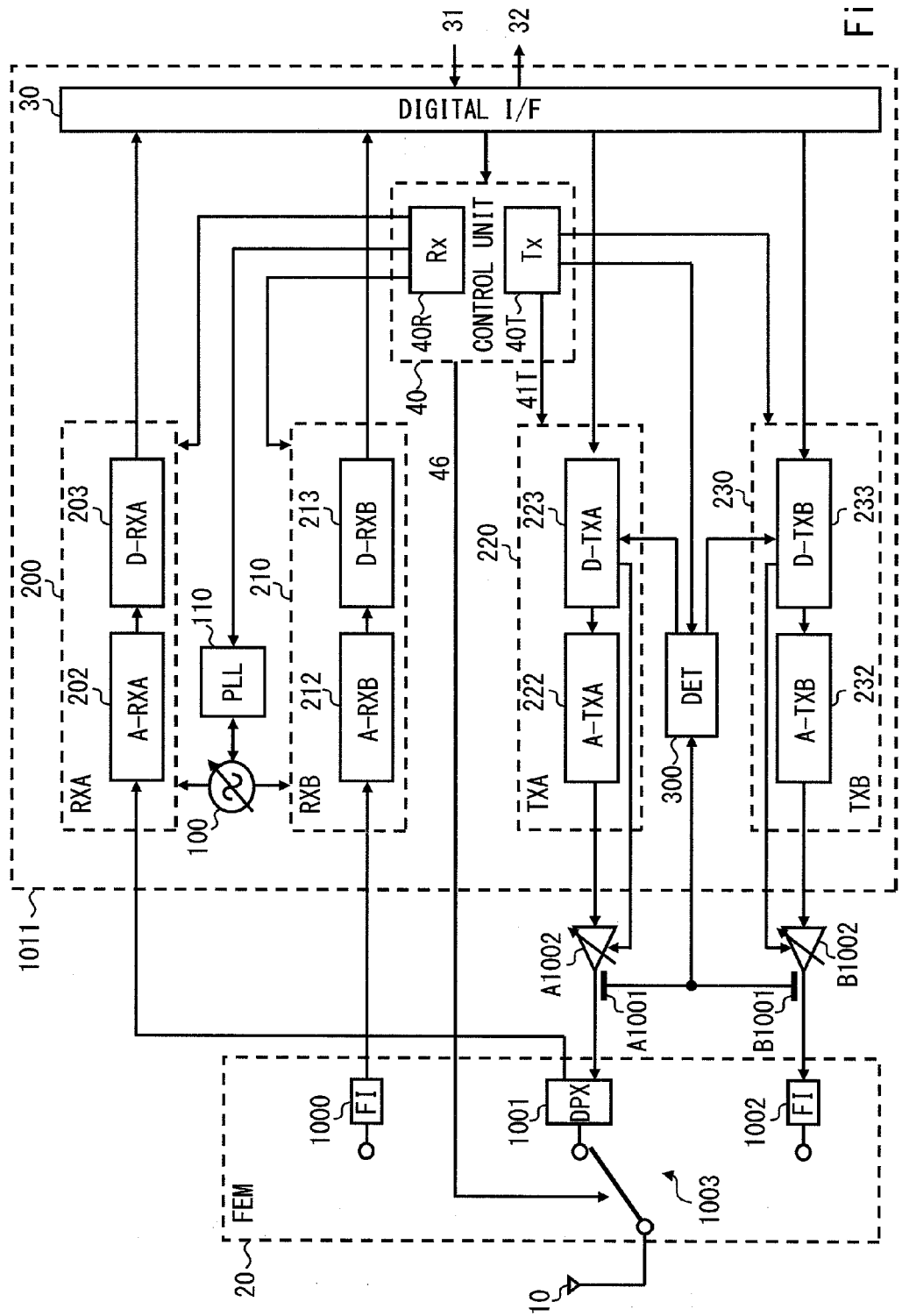
FIG. 13 is a block diagram showing a configuration example of a radio communication terminal according to a fourth embodiment of the present invention.

In a fourth embodiment, an example in which the semiconductor integrated circuit shown in FIG. 2 is applied to a radio communication terminal such as a mobile telephone will be described. FIG. 13 is a block diagram showing a configuration example of the radio communication terminal according to the fourth embodiment. The radio communication terminal shown in FIG. 13 includes two radio access systems using different access methods, and a reception apparatus represented by FIG. 11 is provided in each of the two radio access systems. Specific description will be made below.

The radio communication terminal shown in FIG. 13 includes a semiconductor chip (RFIC) 1011 used as a radio signal processing circuit, an antenna 10, a front end module (FEM) 20, couplers A1001 and B1001, and power amplification circuits (HPA) A1002 and B1002. A reception apparatus (RXA) 200, a reception apparatus (RXB) 210, a transmission apparatus (TXA) 220, a transmission apparatus (TXB) 230, a digital interface circuit (digital I/F) 30, a control unit (control unit) 40, a VCO 100, a PLL 110, and a transmission level detection circuit (DET) 300 are provided on the semiconductor chip 1011.

The control unit 40 includes a reception apparatus control unit 40R and a transmission apparatus control unit 40T. The reception apparatus control unit 40R is a unit that controls the reception apparatuses 200 and 210, and the transmission apparatus control unit 40T is a unit that controls the transmission apparatuses 220 and 230. The reception apparatus 200 includes an analog processor (A-RXA) 202 and a digital processor (D-RXA) 203. The reception apparatus 210 includes an analog processor (A-RXB) 212 and a digital processor (D-RXB) 213.

The transmission apparatus 220 includes an analog processor (A-TXA) 222 and a digital processor (D-TXA) 223. The transmission apparatus 230 includes an analog processor (A-TXB) 232 and a digital processor (D-TXB) 233. The front end module 20 includes band-pass filters 1000 and 1002, a duplexer (DPX) 1001, and a switch 1003.

Subsequently, an operation of the radio communication terminal shown in FIG. 13 will be described. Description of the components already described in FIG. 11 and the like will be omitted.

In the front end module 20, the switch 1003 selects any one of the band-pass filters 1000 and 1002 and the duplexer 1001 based on a control signal 46 from the control unit 40, to connect the selected one and the antenna 10. These filters 1000-1003 perform the following operations when they are connected to the antenna 10.

The duplexer 1001 is to suppress mutual interference between the transmission signal and the reception signal in the radio access system that performs transmission and reception of radio signals. Specifically, the duplexer 1001 suppresses mutual interference between the transmission signal (signal obtained by amplifying the transmission signal of the transmission apparatus (TXA) 220) output from the power amplification circuit A1002 and the radio signal transmitted to the reception apparatus (RXA) 200 received by the antenna 10.

The band-pass filter 1000 outputs the signal to the reception apparatus 210 so as to minimize the loss of the signal in the desired band as much as possible while suppressing signals other than the signal in the desired band among the signals included in the radio signals transmitted to the reception apparatus (RXB) 210 received by the antenna 10.

The band-pass filter 1002 outputs the signal to the antenna 10 so as to minimize the loss of the signal in the desired band as much as possible while suppressing signals other than the signal in the desired band among the signals included in the transmission signals (signal obtained by amplifying the transmission signal of the transmission apparatus (TXB) 230) output from the power amplification circuit B1002.

The fourth embodiment has been described taking a case as an example in which the band-pass filters 1000 and 1002 and the duplexer 1001 are incorporated in the front end module 20. However, it is not limited to this example. One or a plurality of the band-pass filters 1000 and 1002 and the duplexer 1001 may be provided outside the front end module 20.

The reception apparatus 200 and the transmission apparatus 220 connected to the duplexer 1001 are a radio access system in which a frequency division duplex (FDD) system is employed (hereinafter referred to as a radio access system A). The frequency division duplex system includes, for example, WCDMA (Wideband Code Division Multiple Access), LTE (Long Term Evolution) and the like.

The reception apparatus 210 connected to the band-pass filter 1000 and the transmission apparatus 230 connected to the band-pass filter 1002 are a radio access system in which a time division duplex (TDD) system is employed (hereinafter referred to as a radio access system B). The time division duplex system includes, for example, GSM (Global System for Mobile communications) and the like.

The radio access systems provided in the radio communication terminal according to the fourth embodiment are not limited to the above systems, but may employ other systems. While two radio access systems A and B are provided in the radio communication terminal according to the fourth embodiment, it is not limited to this. Any number of radio access systems may be provided so that they can be switched.

The configuration and the operation of the reception apparatus 200 are similar to those of the reception apparatus shown in FIG. 11. Thus, description thereof will be omitted. Further, although the gain and the filter characteristics are different, the configuration and the operation of the reception apparatus 210 are basically similar to those of the reception apparatus shown in FIG. 11, and thus description thereof will be omitted. In short, the reception apparatus to which the present invention represented by FIG. 11 is applied is used as the reception apparatuses 200 and 210.

The switch 1003 provided in the front end module 20 selects any one of the band-pass filters 1000 and 1002 and the duplexer 1001 based on the control signal 46 output from the control unit 40 as described above, and connects the selected one and the antenna 10. For example, when the radio access system A transmits or receives radio signals through the antenna 10, the switch 1003 connects the duplexer 1001 and the antenna 10 based on the control signal 46. Further, when the radio access system B receives radio signals through the antenna 10, the switch 1003 connects the band-pass filter 1000 and the antenna 10 based on the control signal 46. Further, when the radio access system B transmits radio signals through the antenna 10, the switch 1003 connects the band-pass filter 1002 and the antenna 10 based on the control signal 46.

When the radio access system A transmits or receives radio signals, the transmission level detection circuit (DET) 300 detects the output power of the power amplification circuit A1002 through the coupler A1001. The transmission level detection circuit 300 feeds back the detected results to the digital processor (D-TXA) 223 of the transmission apparatus 220, to set the total gain of the transmission apparatus 220 and the gain of the power amplification circuit A1002 to desired values. Note that a direct up system as disclosed in FIG. 2 and FIG. 3 of the literature "Tirdad Sowlati et al., "Quad-Band GSM/GPRS/EDGE Polar Loop Transmitter", IEEE JOURNAL OF SOLID-STATE CIRCUITS, 2004, VOL. 39, No. 12, pp. 2179-2189" is employed as a transmission chain of the radio access system A.

On the other hand, when the radio access system B transmits radio signals, the transmission level detection circuit (DET) 300 detects the output voltage of the power amplification circuit B1002 through the coupler B1001. The transmission level detection circuit 300 feeds back the detected results to the digital processor (D-TXB) 233 of the transmission apparatus 230, to set the total gain of the transmission apparatus 230 and the gain of the power amplification circuit B1002 to desired values. When the transmission signal of the transmission apparatus 230 is 8-phase shift keying (PSK), an envelope is further controlled to be a desired characteristic. Further, when the transmission signal of the transmission apparatus 230 is GMSK (Gaussian Minimum Shift Keying), as disclosed in "Shimizu, T et al., "A Small GSM Power Amplifier Module Using Si-LDMOS Driver MMIC", ISSCC Digest of Technical Papers, 2004, pp. 196-197", the power amplification circuit B1002 may include a gain control function. In such a case, power control by the transmission level detection circuit 300 is not performed. A polar modulation transmitter as disclosed in the literature "Aarno Parssinen, "DIRECT CONVERSION RECEIVERS IN WIDE-BAND SYSTEMS", Kluwer Academic Publishers" is employed, for example, as the transmission chain of the radio access system B.

The semiconductor chip 1011 is controlled by a baseband LSI (not shown) through the digital interface circuit 30. Serial digital signals are transmitted or received between the digital interface circuit 30 and the baseband LSI. The digital interface circuit 30 receives a signal transmitted from the baseband LSI (not shown) as a reception signal 31. The control unit 40 outputs a control signal to control the semiconductor chip 1011 and the front end module 20, data to a circuit (not shown) in the semiconductor chip 1011 and the like based on the reception signal 31 received through the digital interface circuit 30. Further, the digital interface circuit 30 transmits the signal received from the semiconductor chip 1011, states of the semiconductor chip 1011 and the front end module 20 and the like to the baseband LSI as a transmission signal 32.

In the fourth embodiment, serial digital signals are transmitted or received between the digital interface circuit 30 and the baseband LSI. Therefore, it is possible to reduce the number of pins of the semiconductor chip 1011 compared to the case in which parallel digital signals are transmitted or received between the digital interface circuit 30 and the baseband LSI. As a result, it is possible to reduce the size of the semiconductor package on which the semiconductor chip is mounted.

In this way, the semiconductor integrated circuit shown in FIG. 2 can also be applied to the radio communication terminal that can correspond to any number of radio access systems. As a matter of course, the variant examples of the semiconductor integrated circuit shown in FIG. 2 (e.g., semiconductor integrated circuit or the like shown in FIG. 8) may also be applied to the radio communication terminal.

As described above, the semiconductor integrated circuit, and the reception apparatus and the radio communication terminal including the semiconductor integrated circuit according to the above-described embodiments include the voltage generator that generates the predetermined voltage VB, and supply the predetermined voltage to each input terminal of the fully differential amplification circuit (OPA1) via the resistance elements (RBT and RBB). Accordingly, the semiconductor integrated circuit, and the reception apparatus and the radio communication terminal including the semiconductor integrated circuit according to the above described embodiments are able to supply a stable bias voltage to the input side of the fully differential amplification circuit (OPA1) even when the voltages in the input side of the fully differential amplification circuit (OPA1) are temporarily varied unintentionally, thereby being able to promptly return the state of the fully differential amplification circuit (OPA1) to the normal operation.

Note that the present invention is not limited to the embodiments stated above, but may be changed as appropriate without departing from the spirit of the present invention. For example, the configurations of the fully differential amplification circuits OPA1 and OPA2 or the like are not limited to those described above, but may be changed as appropriate to other configurations including the similar functions.

Described above in the embodiments is the case in which the reception apparatus employs the direct conversion system. However, it is not limited to this. The reception apparatus does not necessarily employ the direct conversion system, but may employ the low-IF system or the super heterodyne system.

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit, comprising:
a first capacitance element and a second capacitance element;
a first amplification circuit that amplifies a potential difference of a first voltage signal and a second voltage signal supplied via the first capacitance element and the second capacitance element, respectively, to output a first amplification signal and a second amplification signal;
a first resistance element that feeds back the first amplification signal to one input terminal of the first amplification circuit;
a second resistance element that feeds back the second amplification signal to another input terminal of the first amplification circuit;
a voltage generator that generates a predetermined voltage; and
a third resistance element that transmits the predetermined voltage generated by the voltage generator to each input terminal of the first amplification circuit,
wherein the voltage generator includes a fourth resistance element and a fifth resistance element that are connected in series between a high-potential side power supply and a low potential side power supply, and a diode that clamps the voltage of the node between the fourth resistance element and the fifth resistance element, and wherein the voltage generator generates a voltage of a node between the fourth resistance element and the fifth resistance element as the predetermined voltage.

2. A semiconductor integrated circuit, comprising:
a first capacitance element and a second capacitance element;
a first amplification circuit that amplifies a potential difference of a first voltage signal and a second voltage signal supplied via the first capacitance element and the second capacitance element, respectively, to output a first amplification signal and a second amplification signal;
a first resistance element that feeds back the first amplification signal to one input terminal of the first amplification circuit;
a second resistance element that feeds back the second amplification signal to another input terminal of the first amplification circuit;
a voltage generator that generates a predetermined voltage; and
a third resistance element that transmits the predetermined voltage generated by the voltage generator to each input terminal of the first amplification circuit,
wherein the voltage generator includes a current generator through which a constant current flows, a fourth resistance element that is connected in series with the current generator, and a diode that clamps the voltage of the node between the fourth resistance element and the current generator, and
wherein the voltage generator generates a voltage of a node between the fourth resistance element and the current generator as the predetermined voltage.

3. The semiconductor integrated circuit according to claim 1, wherein the voltage generator comprises a second amplification circuit that amplifies a potential difference between a reference voltage and the predetermined voltage that is fed back, to output the predetermined voltage.

4. The semiconductor integrated circuit according to claim 1, wherein the voltage generator generates the predetermined voltage having a voltage level substantially equal to a voltage level of a common-mode component of the first amplification signal and the second amplification signal output from the first amplification circuit.

5. The semiconductor integrated circuit according to claim 1, further comprising a mixer circuit between the first and the second capacitance elements and the first amplification circuit.

6. The semiconductor integrated circuit according to claim 5, wherein the third resistance element transmits the predetermined voltage generated by the voltage generator to each input terminal of the first amplification circuit via the mixer circuit.

7. The semiconductor integrated circuit according to claim 5, wherein the mixer circuit comprises a plurality of MOS transistors.

8. The semiconductor integrated circuit according to claim 1, wherein the third resistance element is formed of polycrystalline silicon.

9. The semiconductor integrated circuit according to claim 1, wherein the third resistance element comprises a diffused resistor.

10. A reception apparatus that comprises the semiconductor integrated circuit according to claim 1.

11. A radio communication terminal that comprises the semiconductor integrated circuit according to claim 1.

* * * * *